(12) United States Patent
Lee

(10) Patent No.: US 11,830,879 B2
(45) Date of Patent: Nov. 28, 2023

(54) VERTICAL MEMORY DEVICE AND METHOD FOR FABRICATING VERTICAL MEMORY DEVICE

(71) Applicant: SK hynix Inc., Icheon-si (KR)

(72) Inventor: Nam-Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 241 days.

(21) Appl. No.: 17/224,859

(22) Filed: Apr. 7, 2021

(65) Prior Publication Data
US 2021/0225843 A1 Jul. 22, 2021

Related U.S. Application Data

(63) Continuation of application No. 16/686,455, filed on Nov. 18, 2019, now Pat. No. 10,998,316.

(30) Foreign Application Priority Data

Jul. 26, 2019 (KR) .................. 10-2019-0090884

(51) Int. Cl.
| | | |
|---|---|---|
| *H01L 27/102* | (2023.01) | |
| *H01L 21/02* | (2006.01) | |
| *H01L 23/00* | (2006.01) | |
| *H01L 25/18* | (2023.01) | |
| *H01L 29/66* | (2006.01) | |

(Continued)

(52) U.S. Cl.
CPC .... *H01L 27/1027* (2013.01); *H01L 21/02532* (2013.01); *H01L 21/02579* (2013.01); *H01L 21/02595* (2013.01); *H01L 21/30604* (2013.01); *H01L 21/30625* (2013.01); *H01L 21/32133* (2013.01); *H01L 21/76224* (2013.01); *H01L 21/76802* (2013.01); *H01L 21/76877* (2013.01); *H01L 24/03* (2013.01); *H01L 24/08* (2013.01); *H01L 24/32* (2013.01); *H01L 24/83* (2013.01); *H01L 25/18* (2013.01); *H01L 25/50* (2013.01); *H01L 29/66363* (2013.01); *H10B 12/01* (2023.02); *H10B 12/50* (2023.02); *H01L 2224/08147* (2013.01); *H01L 2224/32145* (2013.01); *H01L 2224/80895* (2013.01); *H01L 2224/83896* (2013.01); *H01L 2924/1436* (2013.01)

(58) Field of Classification Search
None
See application file for complete search history.

(56) References Cited

U.S. PATENT DOCUMENTS

| | | | |
|---|---|---|---|
| 6,600,173 | B2 | 7/2003 | Tiwari |
| 7,052,941 | B2 | 5/2006 | Lee |

(Continued)

FOREIGN PATENT DOCUMENTS

| | | |
|---|---|---|
| CN | 107431073 A | 12/2017 |
| KR | 1020100070835 A | 6/2010 |

*Primary Examiner* — Telly D Green
(74) *Attorney, Agent, or Firm* — WILLIAM PARK & ASSOCIATES LTD.

(57) ABSTRACT

A method for fabricating a vertical memory device includes: forming a memory cell array that includes a vertical thyristor and a word line over a first substrate; forming a peripheral circuit unit in a second substrate; bonding the memory cell array with the peripheral circuit unit; removing the first substrate to expose one side of the vertical thyristor; and forming a bit line that is coupled to the one side of the vertical thyristor and the peripheral circuit unit.

12 Claims, 23 Drawing Sheets

(51) Int. Cl.
  *H10B 12/00*      (2023.01)
  *H01L 25/00*      (2006.01)
  *H01L 21/306*     (2006.01)
  *H01L 21/762*     (2006.01)
  *H01L 21/3213*    (2006.01)
  *H01L 21/768*     (2006.01)

(56) References Cited

U.S. PATENT DOCUMENTS

| | | |
|---|---|---|
| 9,361,966 B2 | 6/2016 | Nemati et al. |
| 10,211,166 B2 | 2/2019 | Matsuo |
| 2004/0262635 A1 | 12/2004 | Lee |
| 2005/0280061 A1 | 12/2005 | Lee |
| 2016/0093356 A1 | 3/2016 | Luan et al. |
| 2017/0236574 A1* | 8/2017 | Takahashi ............... H01L 28/90 |
| | | 365/51 |
| 2019/0172838 A1* | 6/2019 | Jo ........................... G11C 7/14 |
| 2019/0326511 A1 | 10/2019 | Lee et al. |
| 2020/0105721 A1 | 4/2020 | Park |

* cited by examiner

VERTICAL MEMORY DEVICE AND METHOD FOR FABRICATING VERTICAL MEMORY DEVICE

CROSS-REFERENCE TO RELATED APPLICATIONS

The present application is a continuation application of U.S. patent application Ser. No. 16/686,455, filed on Nov. 18, 2019, and claims priority of Korean Patent Application No. 10-2019-0090884, filed on Jul. 26, 2019, which is incorporated herein by reference in its entirety.

BACKGROUND

1. Technical Field

Examples of embodiments generally relate to a semiconductor device, and more particularly, to a vertical memory device and a method for fabricating the vertical memory device.

2. Related Art

A unit cell of a memory device includes at least one transistor and at least one data storage device. For example, a unit cell of a Dynamic Random Access Memory (DRAM) uses one capacitor as a data storage device.

As the integration degree of memory devices increases, various technical problems are emerging. For example, as the area of a unit cell decreases, it becomes difficult to secure sufficient capacitance. To solve this problem, vertical memory cells have been proposed.

SUMMARY

In accordance with an embodiment, a method for fabricating a vertical memory device includes: forming a memory cell array that includes a vertical thyristor and a word line over a first substrate; forming a peripheral circuit unit including a second substrate; bonding the memory cell array with the peripheral circuit unit; removing the first substrate to expose one side of the vertical thyristor; and forming a bit line that is coupled to the one side of the vertical thyristor and the peripheral circuit unit.

In accordance with another embodiment, a vertical memory device includes: a peripheral circuit unit that includes at least one control circuit; a memory cell array that includes a vertical thyristor, a word line, and a bit line that are formed above the peripheral circuit unit; a bonding structure that is formed between the memory cell array and the peripheral circuit unit; and a conductive through structure suitable for electrically connecting the peripheral circuit unit and the memory cell array to each other.

DETAILED DESCRIPTION

Figure 1:
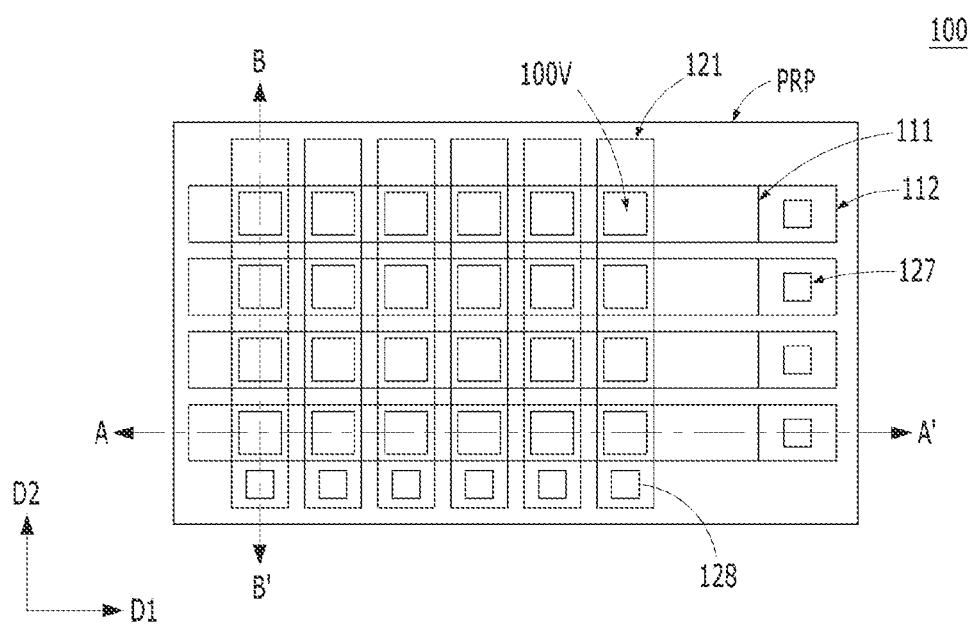
FIGS. 1 to 4 illustrate a memory device in accordance with an embodiment.

Examples of embodiments will be described below with reference to the accompanying drawings. The embodiments may, however, be embodied in different forms and should not be construed as limited to the embodiments set forth herein. Rather, these embodiments are provided so that this disclosure will be thorough and complete, and will fully convey the scope to those skilled in the art. Throughout the disclosure, like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments to be described below propose a capacitor-less 1 T (1 Transistor) Dynamic Random Access Memory (DRAM) that may minimize volatility and power consumption and overcome the limitation in integration degree. The capacitor-less 1 T DRAM may be a thyristor-based random access memory (RAM) that includes a thyristor of a PNPN structure. Cell dimension may be minimized by vertically forming a thyristor of a PNPN structure.

Also, the following embodiments show three-terminal wiring that may be formed based on wafer bonding.

Embodiments may be directed to a highly-integrated vertical memory device, and a method for fabricating the vertical memory device.

FIGS. 1 to 4 illustrate a memory device in accordance with an embodiment.

Figure 2:
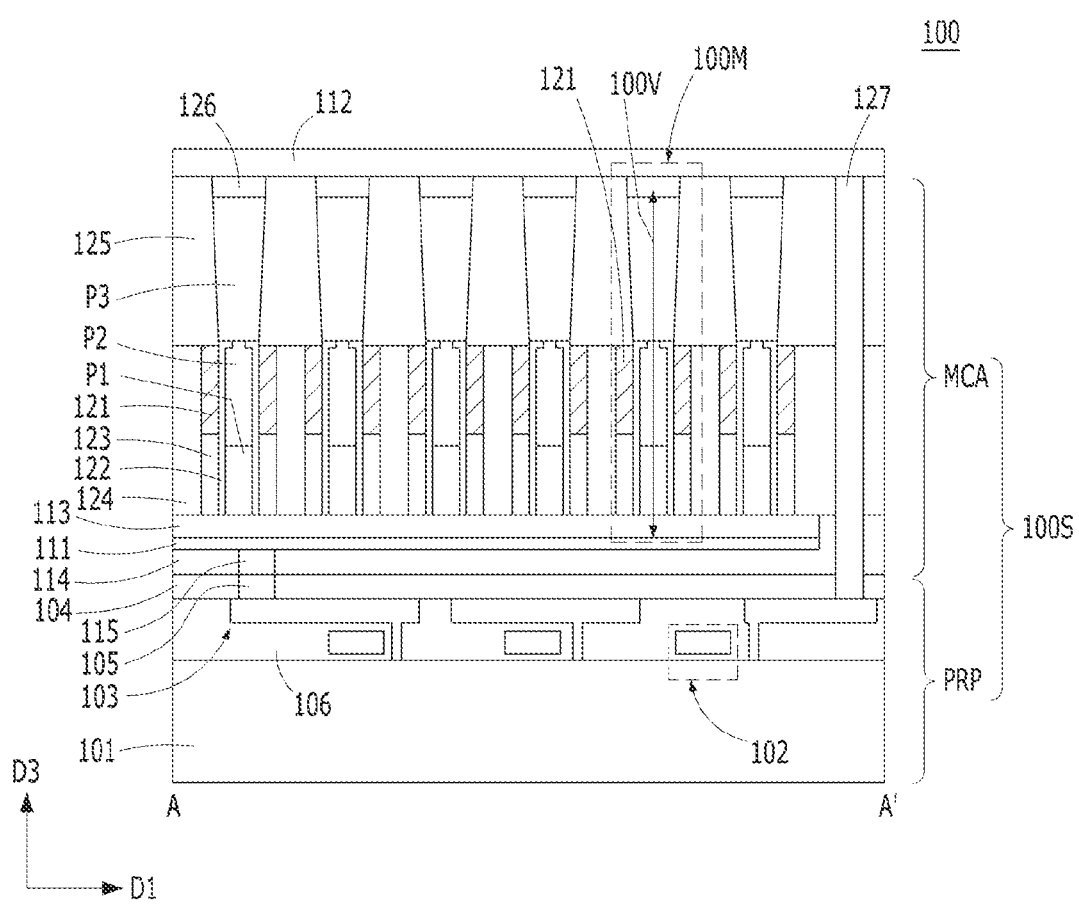
Figure 3:
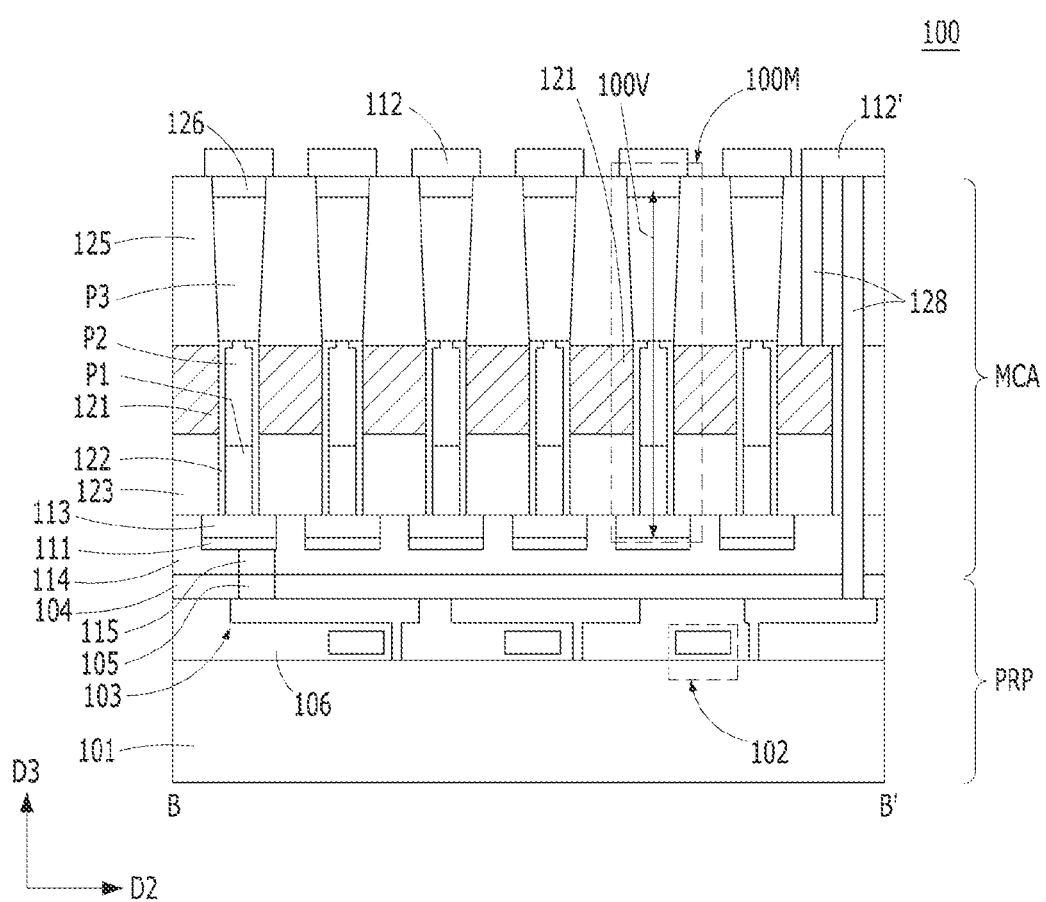
Figure 4:
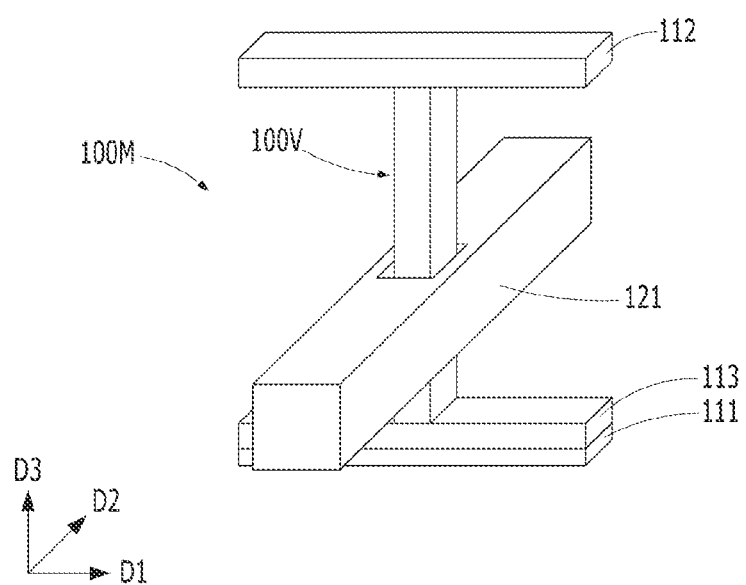

FIG. 1 is a plan view of the memory device, and FIG. 2 is a cross-sectional view taken along a line A-A' shown in FIG. 1. FIG. 3 is a cross-sectional view taken along a line B-B' shown in FIG. 1, and FIG. 4 is a perspective view illustrating a connection relationship between a unit memory cell and a peripheral circuit unit.

Referring to FIGS. 1 to 4, the memory device 100 may include a memory cell array MCA and a peripheral circuit unit PRP. The memory cell array MCA may be positioned at a higher level than the peripheral circuit unit PRP. The memory cell array MCA may include a first bonding material 114 and a first bonding pad 115, and the peripheral circuit unit PRP may include a second bonding material 104 and a second bonding pad 105. The memory cell array MCA and the peripheral circuit unit PRP may be bonded to each other by a bonding process. For example, the memory cell array MCA and the peripheral circuit unit PRP may be bonded by a bonding process of the first bonding material 114 and the second bonding material 104. Also, the memory cell array MCA and the peripheral circuit unit PRP may be bonded by a bonding process of the first bonding pad 115 and the second bonding pad 105. As such, the memory cell array MCA and the peripheral circuit unit PRP may be bonded by a hybrid bonding process. The hybrid bonding process may refer to the bonding process between the first bonding material 114 and the second bonding material 104 and the bonding process between the first bonding pad 115 and the second bonding pad 105.

The bonding process between the first bonding material 114 and the second bonding material 104 may include an oxide-to-oxide bonding. The bonding process between the first bonding pad 115 and the second bonding pad 105 may include a metal-to-metal bonding. In an embodiment, a bonding structure may be formed between the memory cell array MCA and the peripheral circuit unit PRP. In an embodiment, the bonding structure may include the first bonding material 114 and the second bonding material 104.

In an embodiment, the bonding structure may include the first bonding pad 115 and the second bonding pad 105.

According to another embodiment, the memory cell array PRP and the peripheral circuit unit MCA may be directly bonded without using the first and second bonding materials 114 and 104 and the first and second bonding pads 115 and 105.

As described above, the memory cell array MCA and the peripheral circuit unit PRP might not be directly formed on a Silicon-On-Insulator (SOI) substrate, but may be formed by a bonding process using the first and second bonding pads 115 and 105 and the first and second bonding materials 114 and 104.

The peripheral circuit unit PRP may include at least one control circuit 102 for driving the memory cell array MCA. The control circuit 102 of the peripheral circuit unit PRP may include an N-channel transistor, a P-channel transistor, a CMOS circuit, or a combination thereof. The peripheral circuit unit PRP may include an address decoder circuit, a read circuit, a write circuit, and the like.

The peripheral circuit unit PRP may include a semiconductor substrate 101 and control circuits 102 that are arranged on the surface of the semiconductor substrate 101. The semiconductor substrate 101 may be of a material suitable for semiconductor processing. The semiconductor substrate 101 may be formed of a silicon-containing material. The semiconductor substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The semiconductor substrate 101 may include other semiconductor materials, such as germanium. The semiconductor substrate 101 may include a III/V-group semiconductor substrate, for example, a compound semiconductor substrate, such as GaAs.

Each of the control circuits 102 may include at least one transistor. The transistor may be a planar channel transistor. The structure of a transistor in the control circuit 102 may include a recess channel transistor, a buried gate transistor, a fin channel transistor (FinFET), etc. other than the planar channel transistor.

The peripheral circuit unit PRP may further include a plurality of interconnection structures 103 that are coupled to the control circuits 102. The interconnection structures 103 may include at least one metal line. The interconnection structures 103 may include a multi-level metal line (MLM) that includes a plurality of vias and a plurality of metal lines. The interconnection structures 103 may be formed in a lower inter-layer dielectric layer 106.

The peripheral circuit unit PRP may further include a second bonding material 104 over the interconnection structures 103. The second bonding material 104 may include a dielectric material. The second bonding material 104 may include silicon oxide. The second bonding material 104 may cover the interconnection structures 103 and the lower inter-layer dielectric layer 106. The second bonding material 104 may be referred to as a bonding oxide.

The peripheral circuit unit PRP may further include a second bonding pad 105. The second bonding pad 105 may penetrate the second bonding material 104 and be coupled to at least one interconnection structure 103. The second bonding pad 105 may include a metal-based material. The second bonding pad 105 may be referred to as a bonding metal pad.

The memory cell array MCA may include a plurality of memory cells 100M, a lower level conductive line 111, and an upper level conductive line 112. Each of the memory cells 100M may include a word line 121 and a vertical thyristor 100V. The word line 121 may be positioned on a portion of a sidewall of the vertical thyristor 100V. The lower level conductive line 111 may be coupled to one side (or a lower end) of the vertical thyristor 100V, and the upper level conductive line 112 may be coupled to another side (or an upper end) of the vertical thyristor 100V. The lower level conductive line 111 may serve as a source line, and the upper level conductive line 112 may serve as a bit line. The word line 121 may be positioned above the lower level conductive line 111, and the upper level conductive line 112 may be disposed above the word line 121.

The memory cell array MCA may further include the first bonding material 114 and the first bonding pad 115. The first bonding material 114 and the first bonding pad 115 may be positioned below the vertical thyristor 100V. The first bonding material 114 and the first bonding pad 115 may be formed of the same materials as the second bonding material 104 and the second bonding pad 115, respectively. The first bonding material 114 may include silicon oxide, and the first bonding pad 115 may include a metal-based material. The first bonding material 114 may be referred to as a bonding oxide, and the first bonding pad 115 may be referred to as a bonding metal pad.

Each of the lower level conductive line 111 and the upper level conductive line 112 of the memory cell array MCA may be electrically connected to at least one control circuit 102. The lower level conductive line 111 and the control circuits 102 may be coupled to each other through the interconnection structures 103 and the first and second bonding pads 115 and 105. The upper level conductive line 112 and the control circuits 102 may be coupled to each other through a conductive through structure 127. The conductive through structure 127 may be a metal-based material and it may be referred to as a via.

The memory cell array MCA may be positioned above the peripheral circuit unit PRP. Therefore, the memory device 100 may have a Peri under Cell (PUC) structure. According to another embodiment, the memory device 100 may have a Peri Over Cell (POC) structure in which the peripheral circuit unit PRP is positioned above the memory cell array MCA.

The memory cell 100M may be formed above the peripheral circuit unit PRP. The memory cell 100M may include the vertical thyristor 100V which is formed between the lower level conductive line 111 and the upper level conductive line 112. The vertical thyristor 100V may include a source line 113 and a plurality of semiconductor pillars P1, P2, and P3. The source line 113 and the semiconductor pillars P1, P2, and P3 may be vertically arranged between the lower level conductive line 111 and the upper level conductive line 112. The lowest end of the vertical thyristor 100V may be the source line 113, and the semiconductor pillars P1, P2, and P3 may be vertically arranged over the source line 113. The semiconductor pillars P1, P2, and P3 may include a first semiconductor pillar P1, a second semiconductor pillar P2, and a third semiconductor pillar P3. The first semiconductor pillar P1 may be formed over the source line 113, and the second semiconductor pillar P2 may be formed over the first semiconductor pillar P1, and the third semiconductor pillar P3 may be formed over the second semiconductor pillar P2. The third semiconductor pillar P3 may be in contact with the upper level conductive line 112.

The vertical thyristor 100V may include a stack of semiconductor materials. The vertical thyristor 100V may include a silicon material, a silicon germanium material, a gallium arsenide (GaAs) material, or a gallium nitride (GaN)

material. The vertical thyristor 100V may include doped regions that vertically overlap with each other. For example, the first semiconductor pillar P1, the second semiconductor pillar P2, and the third semiconductor pillar P3 that vertically overlap with each other may be doped with different impurities. Herein, different impurities may refer to different conductivity types or different impurity concentrations.

In an embodiment, the first semiconductor pillar P1, the second semiconductor pillar P2, and the third semiconductor pillar P3 may be of silicon materials. Accordingly, the first semiconductor pillar P1, the second semiconductor pillar P2, and the third semiconductor pillar P3 may be referred to as 'a first silicon pillar, a second silicon pillar, and a third silicon pillar', respectively. The first semiconductor pillar P1 may be doped with a first impurity, and the second semiconductor pillar P2 may be doped with a second impurity, and the third semiconductor pillar P3 may be doped with a third impurity. The first impurity and the third impurity may be of the same conductivity type, and the second impurity may be of a conductivity type that is different from the conductivity type of the first and third impurities. For example, the first impurity and the third impurity may be N-type impurities, and the second impurity may be a P-type impurity. The first semiconductor pillar P1 may be doped with a high concentration of the first impurity, and the second semiconductor pillar P2 may not be doped with a high concentration of the second impurity, and the third semiconductor pillar P3 may not be doped with a high concentration of the third impurity. Herein, the term "doped with a high concentration of an impurity" may mean that the concentration of an impurity is higher than the concentration of an impurity that is not doped in a high concentration. Therefore, the first semiconductor pillar P1 may have a higher impurity concentration than the second semiconductor pillar P2 and the third semiconductor pillar P3.

The first semiconductor pillar P1 may include a silicon material doped with an N-type impurity in a high concentration. The second semiconductor pillar P2 may include a silicon material doped with a P-type impurity. The third semiconductor pillar P3 may include a silicon material doped with an N-type impurity. Therefore, the N-type impurity doped in the first semiconductor pillar P1 may have a higher concentration than the concentration of the P-type impurity doped in the second semiconductor pillar P2 and the N-type impurity doped in the third semiconductor pillar P3.

As will be described later, the first semiconductor pillar P1, the second semiconductor pillar P2, and the third semiconductor pillar P3 may be formed by the epitaxial growth of a silicon material. Each of the first semiconductor pillar P1, the second semiconductor pillar P2, and the third semiconductor pillar P3 may be an epitaxial silicon pillar.

The vertical thyristor 100V having the first to third semiconductor pillars P1, P2 and P3 that are vertically aligned may have a substantially reduced area, compared with the structure where the first to third semiconductor pillars P1, P2 and P3 are horizontally aligned. Therefore, the occupying area of the vertical thyristor 100V may be reduced in the memory cell 100M.

The source line 113 of the vertical thyristor 100V may be doped with the same impurity as the second semiconductor pillar P2. The source line 113 may include a silicon material doped with a P-type impurity. The P-type impurity doped in the source line 113 may have a higher concentration than that of the P-type impurity doped in the second semiconductor pillar P2.

As described above, the vertical thyristor 100V may include a stack of silicon materials that are vertically arranged between the lower level conductive line 111 and the upper level conductive line 112. The vertical thyristor 100V may be a stack of silicon materials that are alternately doped with an N-type impurity and a P-type impurity. Since the source line 113 and the second semiconductor pillar P2 are doped with a P-type impurity and the first semiconductor pillar P1 and the third semiconductor pillar P3 are doped with an N-type impurity, the vertical thyristor 100V may have a thyristor of a PNPN structure. The second semiconductor pillar P2 may be a P-based region of the vertical thyristor 100V, and the third semiconductor pillar P3 may be an N-based region of the vertical thyristor 100V. Data may be stored based on the high resistance characteristics and low resistance characteristics of the vertical thyristor 100V.

The word line 121 may include a conductive material. The word line 121 may include a tungsten-based material, for example, tungsten, tungsten nitride, tungsten silicide, or a combination thereof. A gate dielectric layer 122 may be positioned between the word line 121 and the vertical thyristor 100V. The gate dielectric layer 122 may include silicon oxide, silicon nitride, a high dielectric material, or a combination thereof. The upper end of the gate dielectric layer 122 may be bent.

The word line 121 may be positioned on at least one sidewall of the vertical thyristor 100V. For example, the word line 121 may surround the sidewall of the second semiconductor pillar P2 of the vertical thyristor 100V. According to another embodiment, the gate dielectric layer 122 and the word line 121 may be formed on one sidewall of the second semiconductor pillar P2. According to another embodiment, the gate dielectric layer 122 and the word line 121 may be formed on the confronting sidewalls of the second semiconductor pillar P2.

The vertical thyristor 100V may be operated by a bias voltage applied to the word line 121. The second semiconductor pillar P2 of the vertical thyristor 100V may serve as a storage layer. That is, data may be stored in the second semiconductor pillar P2. As described above, the memory cell 100M may use the second semiconductor pillar P2 as a storage without a capacitor.

The first semiconductor pillar P1 of the vertical thyristor 100V may be surrounded by a capping layer 123. The capping layer 123 may be positioned below the word line 121. The capping layer 123 may directly contact the gate dielectric layer 122 and the source line 113.

The neighboring memory cells 100M may be spaced apart from each other by inter-cell isolation layers 124 and 125. The inter-cell isolation layers 124 and 125 may include a dielectric material. The inter-cell isolation layers 124 and 125 may include a first isolation layer 124 and a second isolation layer 125. The first isolation layer 124 may isolate neighboring word lines 121 from each other. The second isolation layer 125 may isolate neighboring third semiconductor pillars P3 from each other.

The upper level conductive line 112 may be coupled to a top portion of the vertical thyristor 100V. In an embodiment, the upper level conductive line 112 may be electrically connected to the third semiconductor pillar P3 of the vertical thyristor 100V. A contact layer 126 may be formed between the upper level conductive line 112 and the third semiconductor pillar P3. The contact layer 126 may include an N-type impurity. The contact layer 126 may be formed by doping an N-type impurity in the upper portion of the third semiconductor pillar P3.

The upper level conductive line 112 may be coupled to the control circuit 102 of the peripheral circuit unit PRP by the conductive through structure 127. The conductive through structure 127 may include a metal-based material. The conductive through structure 127 may be referred to as a via. The conductive through structure 127 may penetrate the inter-cell isolation layers 124 and 125, and may be coupled to the interconnect structure 103 through the first bonding material 114 and the second bonding material 104. When the upper level conductive line 112 includes a bit line, the control circuit 102 of the peripheral circuit unit PRP may include a sense amplifier.

The word line 121 may be coupled to the control circuit 102 of the peripheral circuit unit PRP through a word line contact 128. The word line contact 128 may include a metal-based material. The word line contact 128 may be referred to as a via in the same manner as the conductive through structure 127. The word line contact 128 may penetrate the inter-cell isolation layers 124 and 125 and may be coupled to the interconnection structure 103 through the first bonding material 114 and the second bonding material 104. A metal line 112' may be coupled to the word line contact 128. The metal line 112' may be positioned at the same level as the upper level conductive line 112. The control circuit 102 of the peripheral circuit unit PRP coupled to the word line 121 through the word line contact 128 may include a word line driver.

The upper level conductive line 112 and the word line 121 may be vertically aligned with each other. From the perspective of a top view, the upper level conductive line 112 and the word line 121 may vertically intersect with each other. The source line 113, the lower level conductive line 111, and the upper level conductive line 112 may extend in a first direction D1 that is parallel to an upper plane of the peripheral circuit unit PRP. The word line 121 may extend long in a second direction D2 that intersects with the first direction D1. The vertical thyristor 100V may be formed vertically in a third direction D3.

The word line 121 may be positioned at an upper level than the source line 113, and the source line 113 and the word line 121 may be vertically aligned with each other. From the perspective of a top view, the source line 113 and the word line 121 may vertically intersect with each other, and the lower level conductive line 111, the source line 113, and the upper level conductive line 112 may overlap with each other. The lower level conductive line 111, the source line 113, and the upper level conductive line 112 may extend in the same direction.

According to another embodiment, the position of a stack of the source line 113/the lower level conductive line 111 and the position of the upper level conductive line 112 may be exchanged with each other. For example, the upper level conductive line 112 may be positioned at a lower level, and the stack of the source line 113/the lower level conductive line 111 may be positioned at an upper level. For this, FIGS. 24 to 33 may be referred to.

Figure 5A:
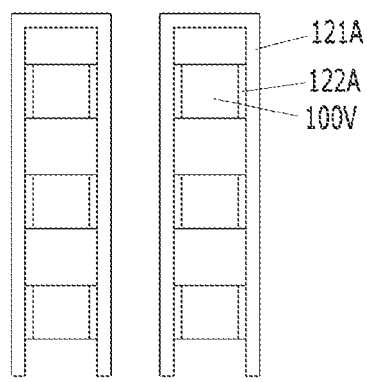
FIGS. 5A to 5C illustrate gates in accordance with modified examples.
Figure 5B:
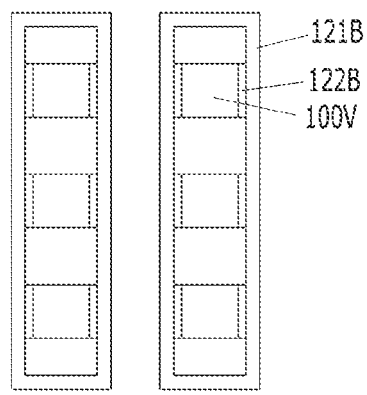
Figure 5C:
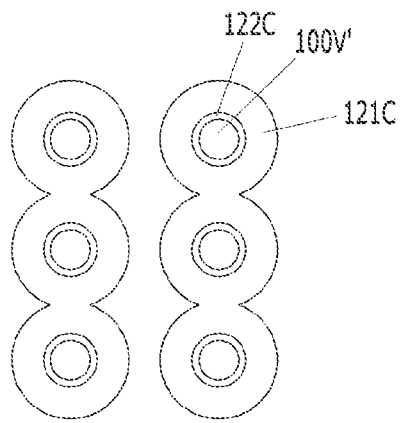

FIGS. 5A to 5C show modifications of a gate.

Referring to FIG. 5A, a gate dielectric layer 122A may be formed on both sidewalls of each vertical thyristor 100V, and gates 121A may have a shape of lines that extend long along the sidewall of a plurality of vertical thyristors 100V. Each of the gates 121A may have a vertical double gate structure positioned on both sidewalls of a vertical thyristor 100V, and the ends of one side of the double gate structures may be coupled to each other. The vertical double gate structure may be formed by depositing a gate material and performing an etch-back process after forming the vertical thyristor 100V. The vertical double gate structure may have a shape of a spacer extending long along both sidewalls of the vertical thyristor 100V.

Referring to FIG. 5B, a gate dielectric layer 122B may be formed on both sidewalls of each vertical thyristor 100V, and the gate 121B may have a shape of a line that extends long along the sidewalls of a plurality of vertical thyristors 100V. The gates 121B may have a double gate structure that is positioned on both sidewalls of the vertical thyristor 100V, and both ends of the double gate structure may be coupled to each other. The gate 121B may have a shape of a closed loop.

Referring to FIG. 5C, a gate dielectric layer 122C may have a shape surrounding each vertical thyristor 100V, and a gate 121C may extend in one direction while surrounding the vertical thyristor 100V'. A cross-section of the vertical thyristor 100V' may be a circular shape. The cross-section of the vertical thyristor 100V shown in FIGS. 5A and 5B may have a rectangular shape.

FIGS. 6 to 23 illustrate a method of fabricating a memory device in accordance with an embodiment.

Figure 6:
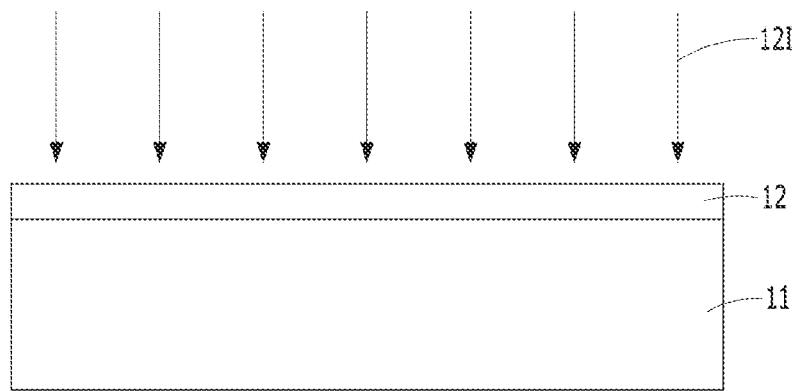
FIGS. 6 to 23 illustrate a method of fabricating a memory device in accordance with an embodiment.

Referring to FIG. 6, a first substrate 11 may be prepared. The first substrate 11 may be a material suitable for semiconductor processing. The first substrate 11 may include a semiconductor substrate. The first substrate 11 may be formed of a silicon-containing material. The first substrate 11 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The first substrate 11 may include other semiconductor materials, such as germanium. The first substrate 11 may include a III/V-group semiconductor substrate, for example, a compound semiconductor substrate, such as GaAs. The first substrate 11 may be a sacrificial substrate removed by the subsequent backside grinding process.

A sacrificial doped region 12 may be formed on the surface of the first substrate 11. The sacrificial doped region 12 may be formed by a doping process 121 of a first dopant. The doping process 121 of the first dopant may include an ion implantation process. The sacrificial doped region 12 may include a first dopant, and the first dopant may include an N-type dopant, a P-type dopant, or a combination thereof. According to an embodiment, the first dopant may include a P-type dopant, such as boron. The sacrificial doped region 12 may be formed by the ion implantation of the P-type dopant, and thus the sacrificial doped region 12 may be referred to as a 'P-type doped region'. The P-type dopant doped in the sacrificial doped region 12 may have a high concentration. For example, the P-type dopant doped in the sacrificial doped region 12 may have a high concentration of approximately $1 \times 10^{19}$ to $5 \times 10^{20}$ atoms/cm$^3$. The sacrificial doped region 12 may be referred to as a 'highly doped P-type doped region'. The sacrificial doped region 12 may include a highly doped P-type silicon material, that is, P$^+$ silicon. The sacrificial doped region 12 may be a sacrificial doped region which is removed by the subsequent backside grinding process.

Figure 7:
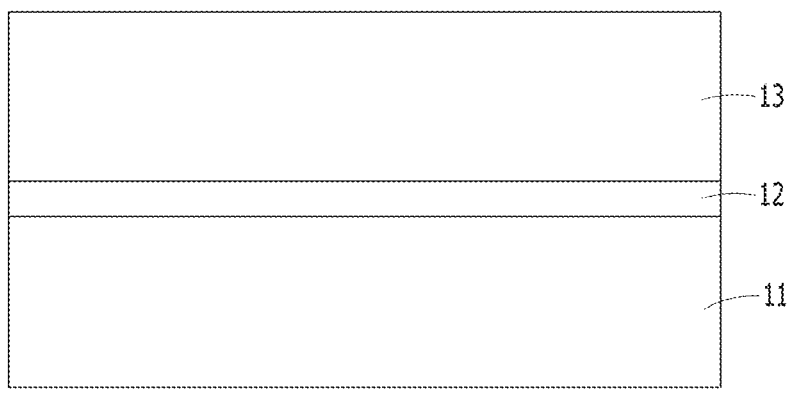

Referring to FIG. 7, a preliminary pillar region 13 may be formed over the sacrificial doped region 12. The preliminary pillar region 13 may be formed by an epitaxial growth process. The preliminary pillar region 13 may include a second dopant. The preliminary pillar region 13 may include an N-type dopant, such as phosphorous or arsenic. The preliminary pillar area 13 may have a thickness of approximately 2000 Å. The preliminary pillar region 13 may be referred to as an 'N-type doped region'. The N-type dopant doped in the preliminary pillar region 13 may not have a high concentration. For example, the N-type dopant doped in the preliminary pillar region 13 may have a lower concentration than approximately $1\times10^{19}$ atoms/cm$^3$. The preliminary pillar region 13 may include an N-type silicon material, that is, N silicon.

Figure 8:
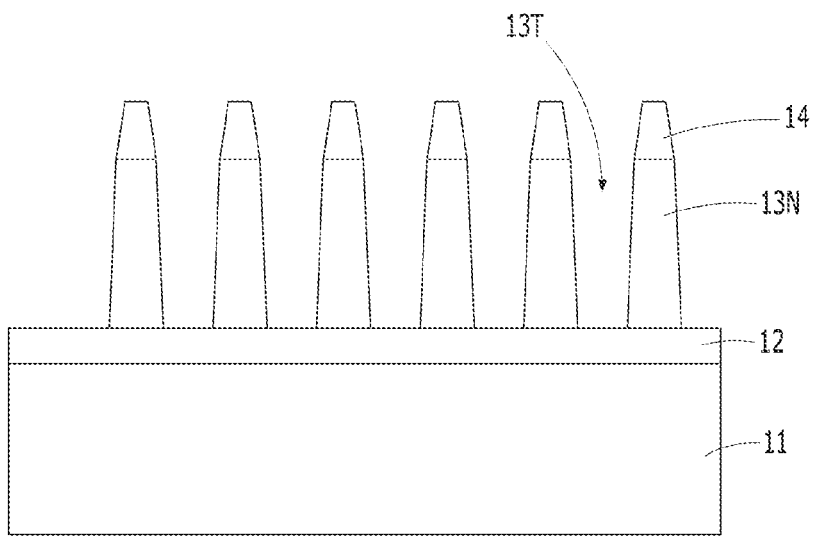

Referring to FIG. 8, a hard mask layer 14 may be formed over the preliminary pillar region 13. The hard mask layer 14 may include a material having an etch selectivity with respect to the preliminary pillar region 13. The hard mask layer 14 may include silicon oxide, silicon nitride, amorphous carbon, or a combination thereof. In an embodiment, the hard mask layer 14 may include silicon oxide.

Using a mask (not shown), the hard mask layer 14 may be etched to expose the top surface of the preliminary pillar region 13. The mask may include a photoresist pattern. From the perspective of a top view, the hard mask layer 14 may have a plurality of pillar shapes. That is, the hard mask layer 14 may be formed of a regular array of pillar shapes.

Subsequently, a first semiconductor pillar 13N may be formed. The first semiconductor pillar 13N may be formed by etching the preliminary pillar region 13 by using the hard mask layer 14. Since the hard mask layer 14 has a plurality of pillar arrays, the preliminary pillar region 13 may be etched into the first semiconductor pillars 13N. The first semiconductor pillar 13N may be formed as a regular array of pillar shapes.

An isolation trench 13T may be defined between the neighboring first semiconductor pillars 13N. Neighboring first semiconductor pillars 13N may be spaced apart from each other by the isolation trench 13T. The depth of the isolation trench 13T may be the same as the height of the first semiconductor pillar 13N. The bottom surface of the isolation trench 13T may extend to the top surface of the sacrificial doped region 12. The height of the first semiconductor pillar 13N may be approximately 2000 Å. The depth of the isolation trench 13T may be the same as the height of the first semiconductor pillar 13N. The depth of the isolation trench 13T may be approximately 2000 Å. According to another embodiment, the depth of the isolation trench 13T may be greater than the height of the first semiconductor pillar 13N.

From the perspective of a top view, a cross-section of the first semiconductor pillar 13N may have a rectangular shape or a circular shape. In an embodiment, the cross-section of the first semiconductor pillar 13N may have a rectangular shape.

The first semiconductor pillar 13N may be an N-type silicon pillar.

Figure 9:
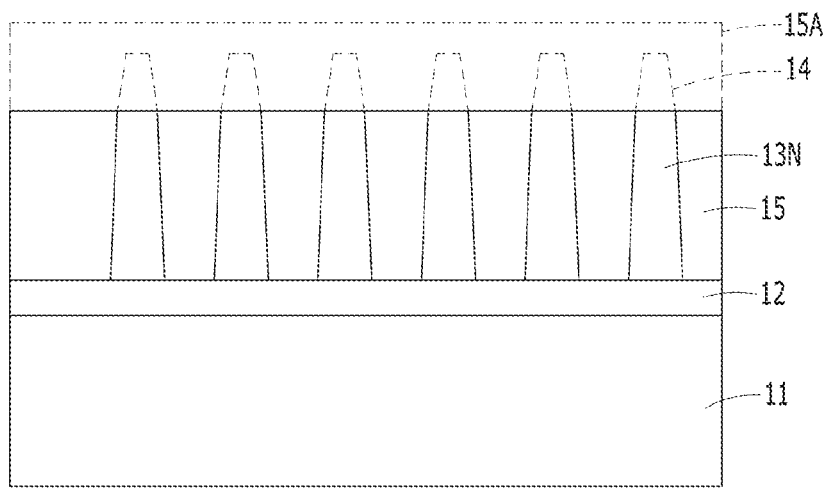

Referring to FIG. 9, the isolation trench 13T may be filled with a dielectric material 15A. The dielectric material 15A may fill the isolation trench 13T without voids. The dielectric material 15A may include a material having excellent gap-fill characteristics. The dielectric material 15A may include an oxide, a nitride, or a combination thereof. In an embodiment, the dielectric material 15A may include silicon oxide.

The dielectric material 15A may be formed to cover the hard mask layer 14 while filling the isolation trench 13T. Subsequently, the dielectric material 15A may be planarized to expose the top surface of the first semiconductor pillar 13N. The dielectric material 15A may be planarized by a Chemical Mechanical Polishing (CMP) process. The first isolation layer 15 may be formed by the planarization of the dielectric material 15A.

In the planarization process of the dielectric material 15A, the hard mask layer 14 may also be planarized and removed.

Therefore, the top surface of the first isolation layer 15 and the top surface of the first semiconductor pillar 13N may be positioned at the same level. In other words, a step may not be formed between the top surface of the first isolation layer 15 and the top surface of the first semiconductor pillar 13N. The first isolation layer 15 may isolate the neighboring first semiconductor pillars 13N from each other.

Figure 10:
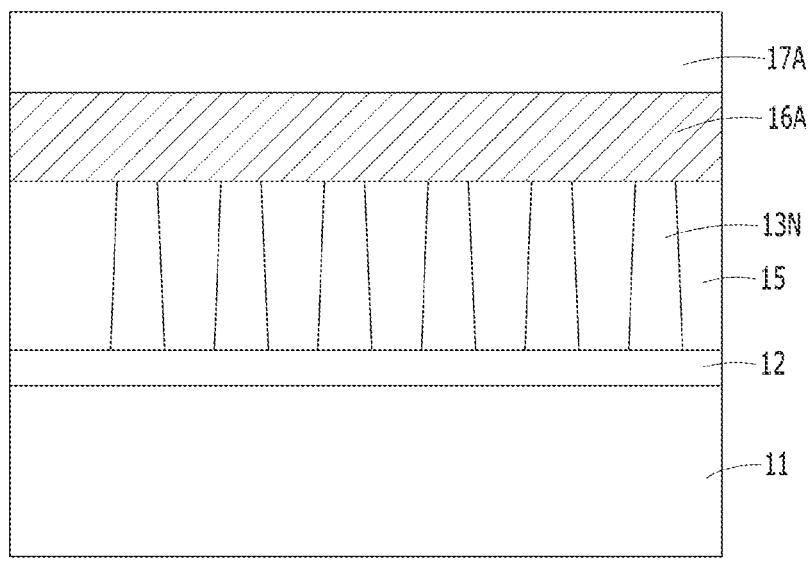

Referring to FIG. 10, a conductive material 16A may be formed over the first isolation layer 15 and the first semiconductor pillar 13N. The conductive material 16A may have a thickness smaller than the height of the first semiconductor pillar 13N. The conductive material 16A may include a metal, a metal nitride, a metal silicide, or a combination thereof. The conductive material 16A may include tungsten, titanium nitride, tungsten nitride, titanium silicide, tungsten silicide, or a combination thereof. According to an embodiment, the conductive material 16A may include tungsten silicide.

A capping material 17A may be formed over the conductive material 16A. The capping material 17A may include a dielectric material. The capping material 17A may include an oxide. The capping material 17A may be used as a hard mask.

Figure 11:
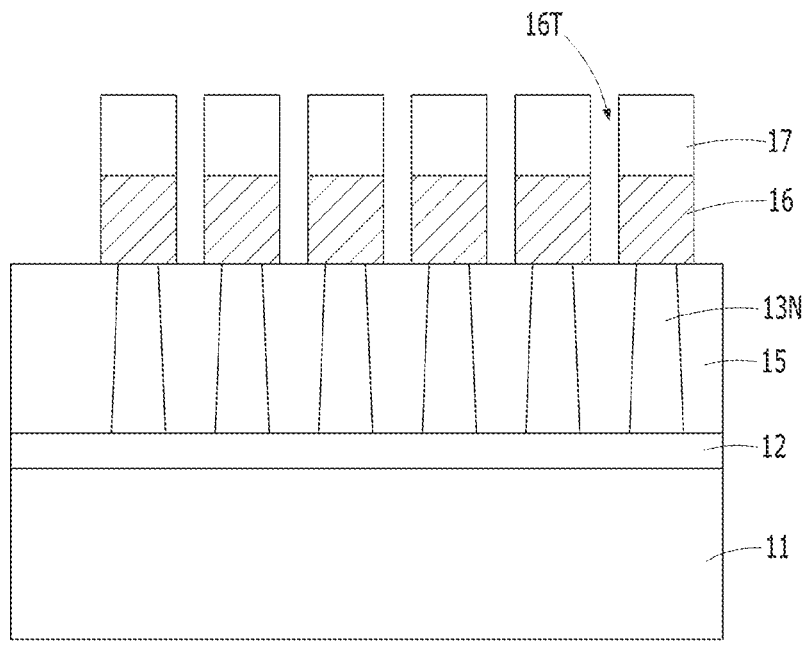

Referring to FIG. 11, a plurality of word lines 16 may be formed. In order to form the word line 16, the capping material 17A and the conductive material 16A may be etched by using a mask layer (not shown) of a line and space pattern. A gate isolation trench 16T may be formed between the adjacent word lines 16. The capping layer 17 may be formed on the word line 16. The capping layer 17 may be formed by etching the capping material 17A.

The word lines 16 may be formed to correspond to the first semiconductor pillars 13N, respectively. The word lines 16 may also be referred to as gates.

Figure 12:
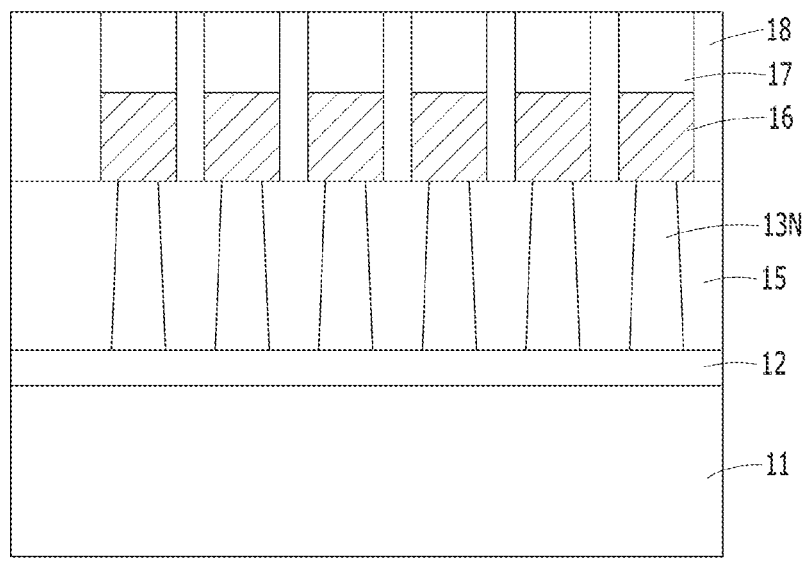

Referring to FIG. 12, a second isolation layer 18 may be formed between the word lines 16. The second isolation layer 18 may include silicon oxide. The second isolation layer 18 may fill the gate isolation trench 16T and may be planarized to expose the top surface of the word line 16.

Figure 13:
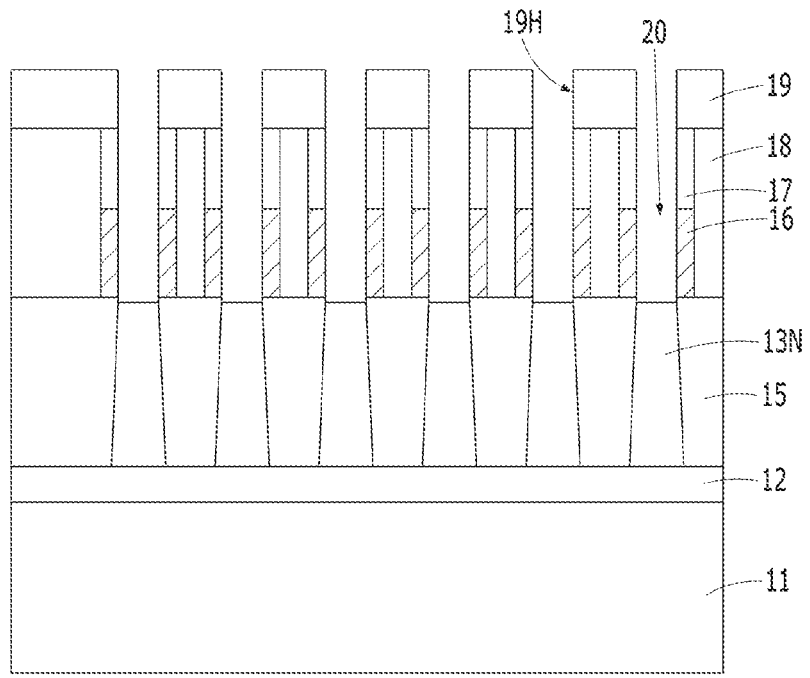

Referring to FIG. 13, a mask layer 19 may be formed. The mask layer 19 may include a photoresist pattern. The mask layer 19 may include a plurality of openings 19H. From the perspective of a top view, a cross-section of the openings 19H may be rectangular or circular in shape, and the openings 19H may be formed in a regular array.

Subsequently, the capping layer 17 and the word line 16 may be sequentially etched by using the mask layer 19. As a result, a plurality of vertical openings 20 may be formed. The vertical openings 20 may have a depth penetrating the capping layer 17 and the word lines 16. From the perspective of a top view, a cross-section of the vertical openings 20 may be the same shape as the openings 19H of the mask layer 19. The bottom surface of the vertical openings 20 may expose the top surface of the first semiconductor pillar 13N. The width (or diameter) of the vertical openings 20 may be greater than the width of the first semiconductor pillar 13N, and thus the bottom surface of the vertical openings 20 may further expose a portion of the surface of the first isolation layer 15. Also, the first semiconductor pillar 13N and the word lines 16 may not contact each other by the vertical openings 20. The vertical openings 20 may have a vertical sidewall. The vertical openings 20 may have a size that does not expose both sidewalls of the word lines 16. In other words, the vertical openings 20 may not cut the word lines 16. Thus, in the top view, the vertical openings 20 may be shaped to be surrounded by the word lines 16.

Figure 14:
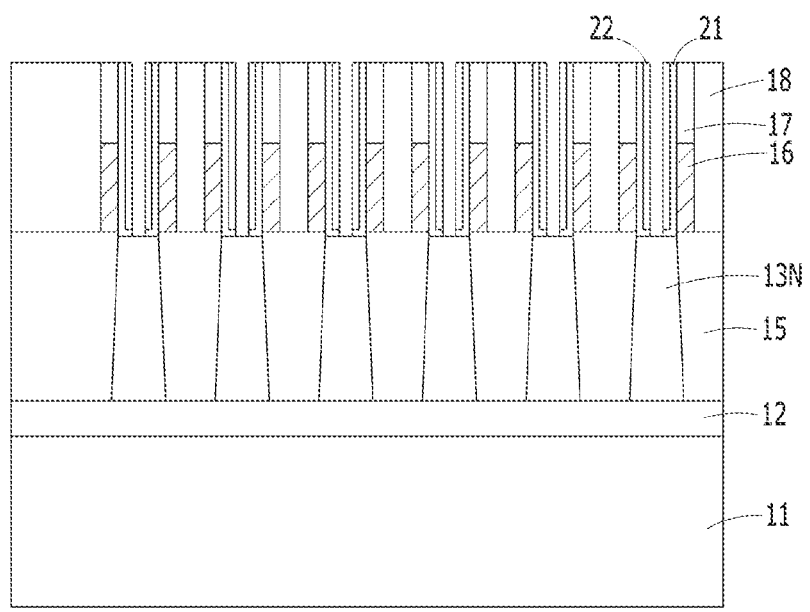

Referring to FIG. 14, after the mask layer 19 is removed, a gate dielectric layer 21 may be formed in the vertical openings 20. The gate dielectric layer 21 may not completely fill the vertical openings 20. The gate dielectric layer 21 may be conformally formed to cover the bottom and sidewalls of the vertical openings 20. The gate dielectric layer 21 may include silicon oxide, silicon oxynitride, a high dielectric material, or a combination thereof. A portion of the gate dielectric layer 21 may be in direct contact with the word lines 16 and the capping layer 17. The gate dielectric layer 21 may isolate the word lines 16 from the first semiconductor pillars 13N.

The sacrificial layer 22 may be formed over the gate dielectric layer 21. The sacrificial layer 22 may be conformally formed over the gate dielectric layer 21. The gate dielectric layer 21 and the sacrificial layer 22 may not completely fill the vertical openings 20. The sacrificial layer 22 may have an etch selectivity with respect to the gate dielectric layer 21. The sacrificial layer 22 may include silicon nitride.

Subsequently, an etch-back process can be performed. A portion of the sacrificial layer 22 and a portion of the gate dielectric layer 21 may be etched by the etch-back process. For example, a portion of the sacrificial layer 22 and a portion of the gate dielectric layer 21 may be etched at the bottom of the vertical openings 20.

The top surface of the first semiconductor pillar 13N may be exposed by the etch-back process. A stack of the gate dielectric layer 21 and the sacrificial layer 22 may remain on the sidewall of the vertical openings 20. The gate dielectric layer 21 may have a shape of a spacer covering the sidewall of each vertical opening 20. The sacrificial layer 22 may have a shape of a spacer covering the sidewalls of the gate dielectric layer 21. From the perspective of a top view, the gate dielectric layer 21 may be a ring-shaped spacer covering the sidewall of each vertical opening 20. The sacrificial layer 22 may be a ring-shaped spacer covering the sidewall of the gate dielectric layer 21.

After an etch-back process is performed onto the sacrificial layer 22, the top surface of the first semiconductor pillar 13N may be recessed to a predetermined depth by downward expansion of the vertical openings 20. For example, the top surface of the first semiconductor pillar 13N may be etched by being self-aligned with the sidewall of the sacrificial layer 22.

Figure 15:
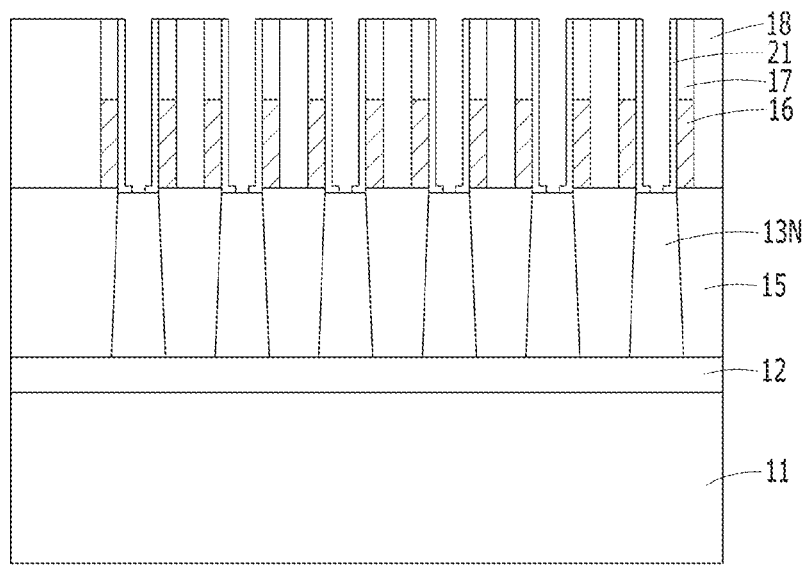

Referring to FIG. 15, the sacrificial layer 22 may be removed. When the sacrificial layer 22 includes silicon nitride, the sacrificial layer 22 may be removed by a wet etch process that uses phosphoric acid.

After the sacrificial layer 22 is removed, the gate dielectric layer 21 may remain on the sidewall of the vertical opening 20.

The vertical openings 20 may be formed to correspond to the first semiconductor pillars 13N, respectively.

Figure 16:
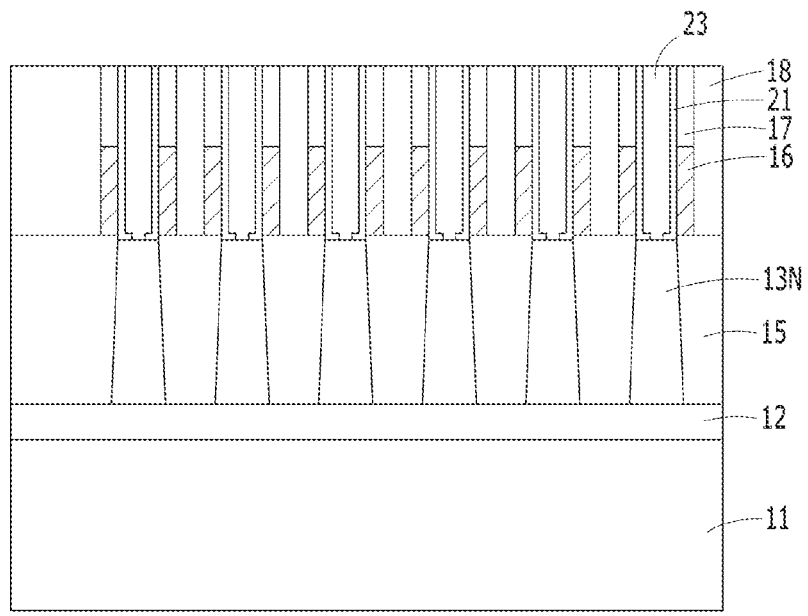

Referring to FIG. 16, an epitaxial layer 23 may be formed in the vertical openings 20. The epitaxial layer 23 may fill the vertical openings 20 without voids. The epitaxial layer 23 may fill the vertical openings 20 over the first semiconductor pillar 13N, and thus the epitaxial layer 23 may have a pillar shape. The epitaxial layer 23 may include a third dopant. The third dopant may be doped in situ while the epitaxial layer 23 grows. The third dopant may include a material that is different from that of the second dopant. The third dopant may include a P-type dopant. The epitaxial layer 23 may include P-type epitaxial silicon. The P-type dopant of the epitaxial layer 23 may not have a high concentration. For example, the P-type dopant of the epitaxial layer 23 may have a lower concentration than $1\times10^{19}$ atoms/cm$^3$.

Figure 17:
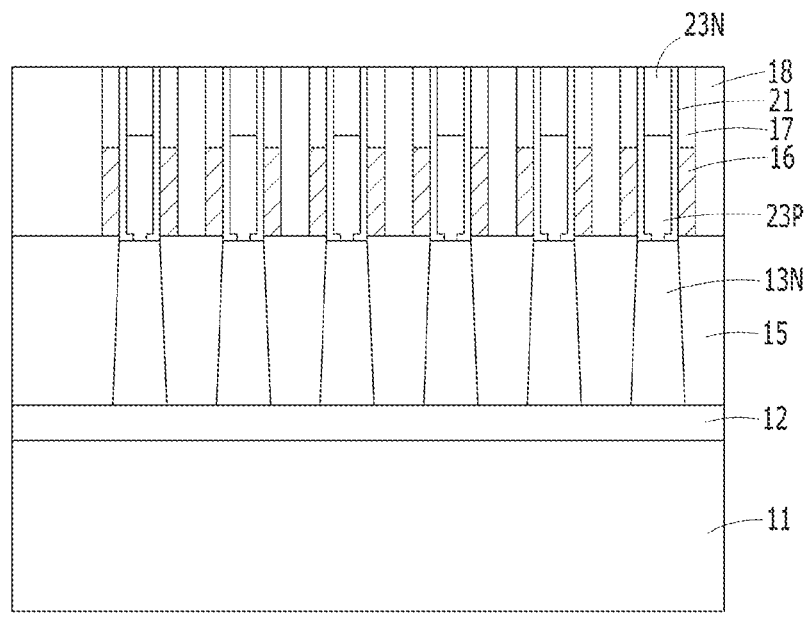

Referring to FIG. 17, the epitaxial layer 23 may be doped with a fourth dopant. The fourth dopant may be of a material that is different from that of the third dopant. The fourth dopant may include an N-type dopant. The fourth dopant may be doped in a high concentration. The N-type dopant may be doped by an ion implantation process. The N-type dopant may have a high concentration of approximately $1\times10^{19}$ to $5\times10^{20}$ atoms/cm$^3$.

As the N-type dopant is doped, the upper region of the epitaxial layer 23 may be defined as a third semiconductor pillar 23N. The lower region of the epitaxial layer 23 may include the dopant of the initial epitaxial layer. Hereinafter, the lower region of the epitaxial layer 23 may be referred to as a second semiconductor pillar 23P.

As described above, as the N-type dopant is doped, the epitaxial layer 23 may be divided into a second semiconductor pillar 23P and a third semiconductor pillar 23N. The second semiconductor pillar 23P may be formed over the first semiconductor pillar 13N, and the third semiconductor pillar 23N may be formed over the second semiconductor pillar 23P. The top surface of the third semiconductor pillar 23N and the top surface of the capping layer 17 may be positioned at the same level.

The top surface of the second semiconductor pillar 23P may be positioned at the same level as the top surface of the word line 16 or higher than the top surface of the word line 16. The third semiconductor pillar 23N may have a height lower than that of the second semiconductor pillar 22P. The lower end of the second semiconductor pillar 23P may directly contact the first semiconductor pillar 13N.

The third semiconductor pillar 23N may include an N-type dopant having a higher concentration than that of the first semiconductor pillar 13N. The second semiconductor pillar 23P may include a P-type dopant having a lower concentration than that of the third semiconductor pillar 23N. In other words, the third semiconductor pillar 23N may include a high-concentration N-type dopant, and the second semiconductor pillar 23P may include a P-type dopant having a lower concentration than that of the high-concentration N-type dopant.

The second semiconductor pillar 23P may be P-type epitaxial silicon, and the third semiconductor pillar 23N may be highly doped N-type epitaxial silicon.

Since the second semiconductor pillar 23P and the third semiconductor pillar 23N fill the vertical opening 20, the vertical opening 20 may be filled with a pillar structure. The stack of the first semiconductor pillar 13N, the second semiconductor pillar 23P, and the third semiconductor pillar 23N may form a vertical pillar structure. The stack of the first semiconductor pillar 13N, the second semiconductor pillar 23P, and the third semiconductor pillar 23N may be a stack of silicon materials. The stack of the first semiconductor pillar 13N, the second semiconductor pillar 23P and the third semiconductor pillar 23N may be a stack of epitaxial silicons.

Figure 18:
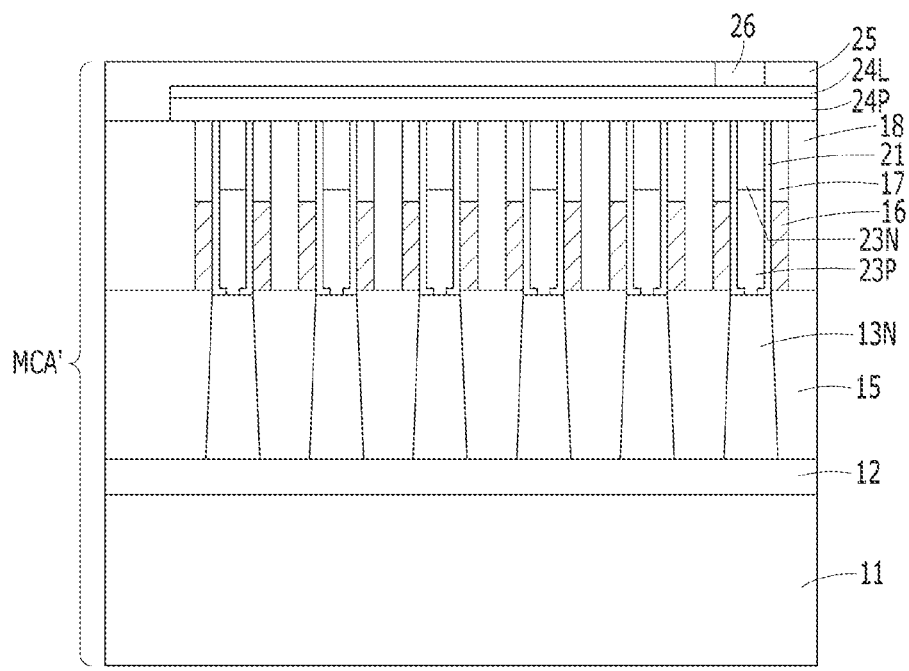

Referring to FIG. 18, a lower level conductive line may be formed. The lower level conductive line may include a stack of a source line 24P and a first conductive line 24L. The source line 24P may include a high-concentration P-type dopant. The source line 24P may include high-concentration P-type polysilicon. The source line 24P may couple the neighboring third semiconductor pillars 23N. In order to form the source line 24P and the first conductive line 24L, the conductive material and the source line material may be etched after deposition of a source line material and a conductive material. The source line 24P and the first conductive line 24L may extend in a direction intersecting with the word line 16.

A first bonding material 25 may be formed over the first conductive line 24L. The first bonding material 25 may include silicon oxide. A portion of the first bonding material 25 may cover the second separation layer 18.

A first bonding pad 26 coupled to the first conductive line 24L may be formed by penetrating the first bonding material 25. The first bonding pad 26 may include a metal-based material.

A memory cell array MCA' may be formed through a series of processes as described above.

Figure 19:
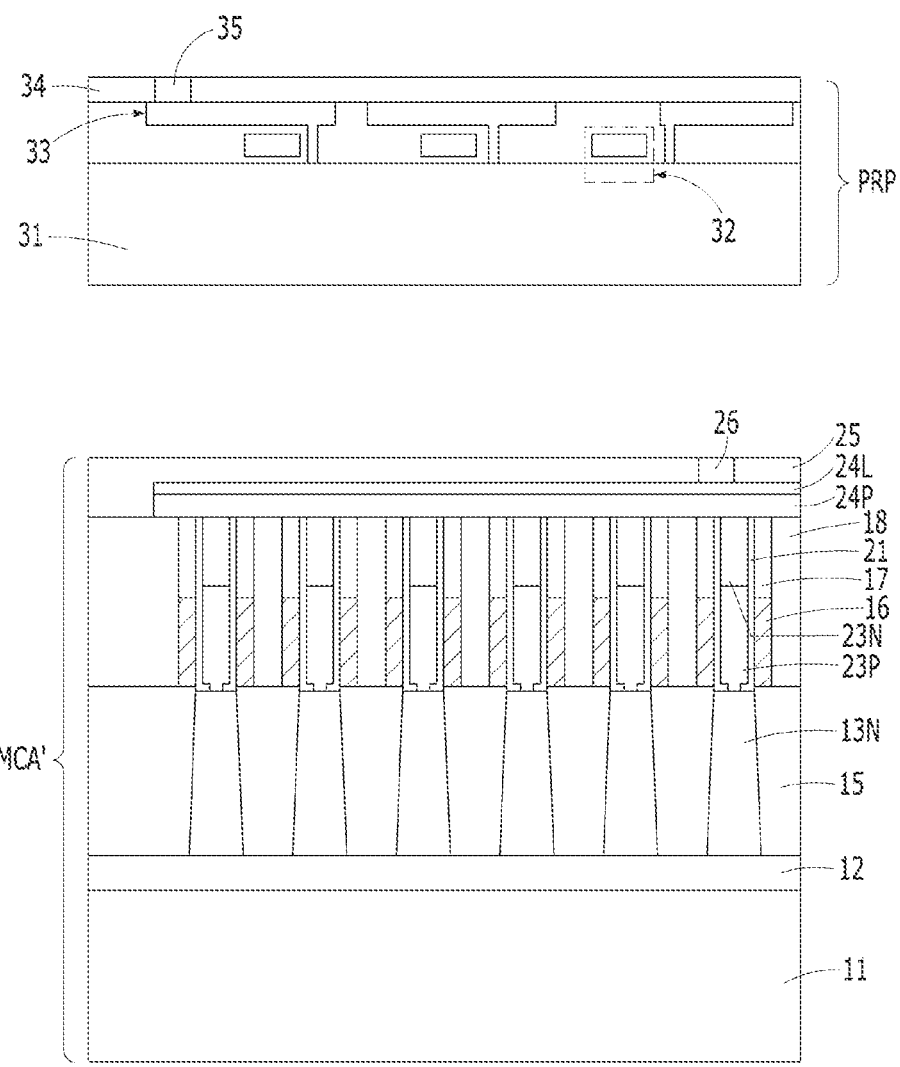

Referring to FIG. 19, a peripheral circuit unit PRP may be prepared. The peripheral circuit unit PRP may include a second substrate 31, at least one control circuit 32 formed over the second substrate 31, an interconnection structure 33, and a second bonding material 34. The at least one control circuit 32 may include a transistor. The interconnection structure 33 may include at least one metal line. The interconnect structure 33 may include a multi-level metal line (MLM). The interconnection structure 33 may be coupled to a portion of the control circuit 32.

The interconnection structure 33 may be formed in an inter-layer dielectric layer (not shown, see '106' in FIG. 2), and the second bonding material 34 may be formed over the inter-layer dielectric layer and the interconnection structure 33. The second bonding material 34 may include silicon oxide. The first bonding material 25 and the second bonding material 34 may be of the same material.

Subsequently, a second bonding pad 35 coupled to the interconnection structure 33 may be formed by penetrating the second bonding material 34. The second bonding pad 35 may include a metal-based material. The first bonding pad 26 and the second bonding pad 35 may be formed of the same material.

Figure 20:
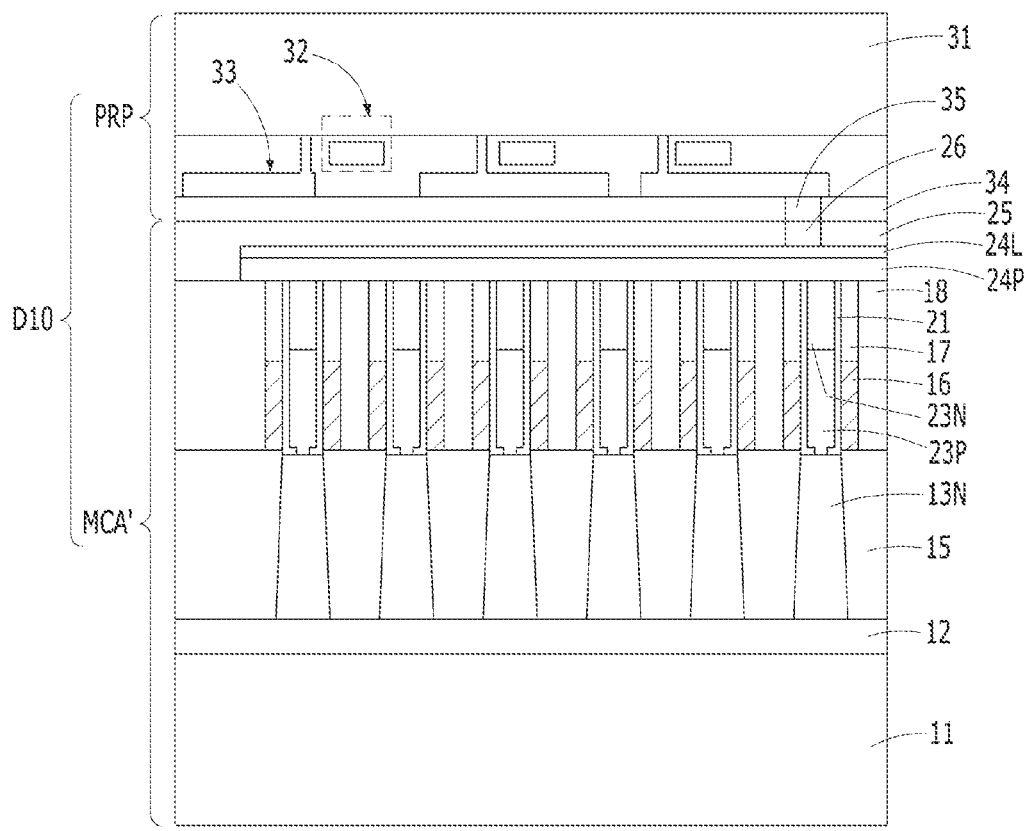

Referring to FIG. 20, a hybrid bonding process may be performed to bond a memory cell array MCA' and a peripheral circuit unit PRP.

The hybrid bonding process may invert (or rotate) the second substrate 31 where the peripheral circuit part PRP is formed and bond it with a first substrate 11 where the memory cell array MCA' is formed. As a result, the first bonding material 25 and the second bonding material 34 may be bonded, and the first bonding pad 26 and the second bonding pad 35 may be bonded.

As a result of the hybrid bonding process described above, an initial substrate stack D10 in which the first substrate 11 where the memory cell array MCA' is formed and the second substrate 31 where the peripheral circuit unit PRP is formed are bonded may be formed.

According to another embodiment, the hybrid bonding process may invert (or rotate) the first substrate 11 where the memory cell array MCA' is formed and bond the inverted first substrate 11 with the second substrate 31 where the peripheral circuit unit PRP is formed.

Figure 21:
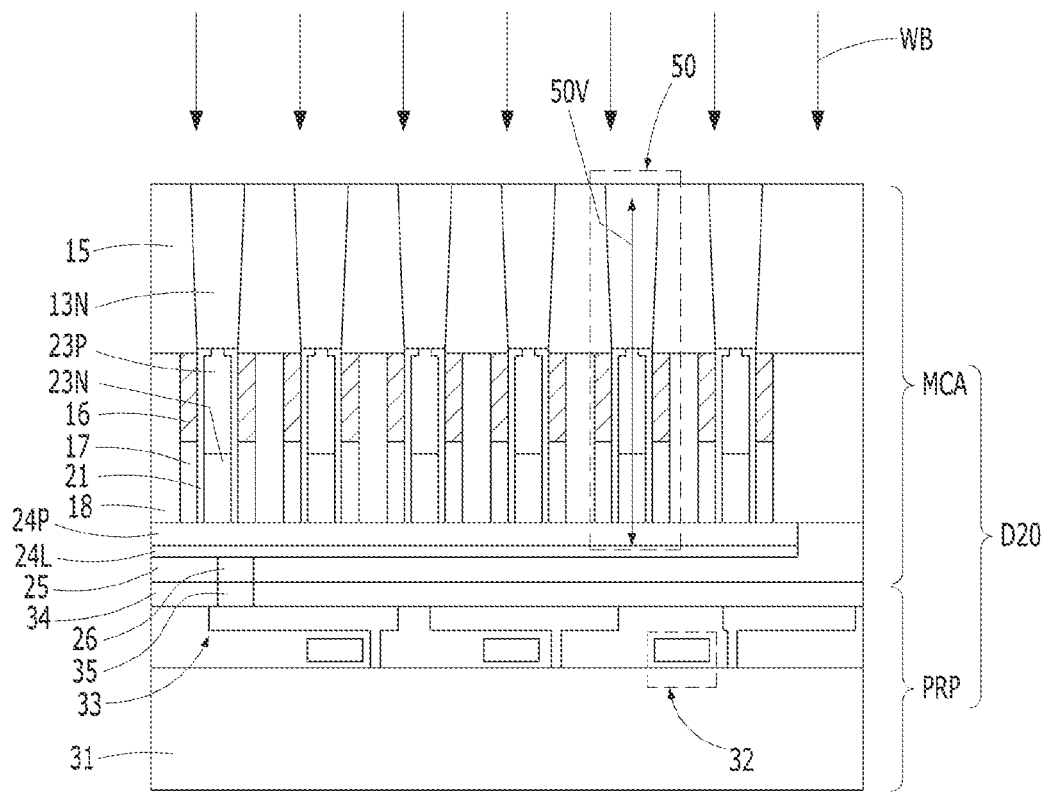

Referring to FIG. 21, a rear surface of the initial substrate stack D10 may be formed to be thin. A sacrificial doped region 12 and the first substrate 11 may be removed (see a reference symbol 'WB') by inverting the initial substrate stack D10 such that the peripheral circuit unit PRP is positioned below. The process of removing the sacrificial doped region 12 and the first substrate 11 may include a backside graining process, a wet etch process, and a CMP process that are sequentially performed. The backside grinding process and wet etch process may remove the first substrate 11 and the sacrificial doped region 12, and the CMP process may remove residual materials. The CMP process may stop at the first isolation layer 15. One surface of the first semiconductor pillar 13N may be exposed after the removal of the sacrificial doped region 12 and the first substrate 11. As a result, a memory cell array MCA thinner than the initial memory cell array MCA' may be formed.

After the sacrificial doped region 12 and the first substrate 11 are removed as described above, a substrate stack D20 for the memory device may be formed.

The substrate stack D20 may be a stack of the peripheral circuit unit PRP and the memory cell array MCA. The memory cell array MCA may be positioned at an upper level than the peripheral circuit unit PRP. The memory cell array MCA may include a plurality of memory cells 50, and each of the memory cells 50 may include a stack of a source line 24P, a third semiconductor pillar 23N, a second semiconductor pillar 23P, and a first semiconductor pillar 13N. The third semiconductor pillar 23N may be referred to as a lower semiconductor pillar, and the first semiconductor pillar 13N may be referred to as an upper semiconductor pillar, and the second semiconductor pillar 23P may be referred to as a storage pillar. The stack of the source line 24P, the third semiconductor pillar 23N, the second semiconductor pillar 23P, and the first semiconductor pillar 13N may be a stack of silicon materials of a PNPN structure. In an embodiment, the PNPN structure includes a first P-type silicon, a first N-type silicon, a second P-type silicon, and a second N-type silicon which are sequentially stacked. The third semiconductor pillar 23N may correspond to the first semiconductor pillar P1 shown in FIG. 2, and the second semiconductor pillar 23P may correspond to the second semiconductor pillar P2 shown in FIG. 2, and the first semiconductor pillar 13N may correspond to the third semiconductor pillar P3 shown in FIG. 2.

Accordingly, each of the memory cells 50 of the memory cell array MCA may include a vertical thyristor 50V having a PNPN structure. In an embodiment, the vertical thyristor 50V includes the source line 24P, the third semiconductor pillar 23N, the second semiconductor pillar 23P, and the first semiconductor pillar 13N which are sequentially stacked. The source line 24P and the second semiconductor pillar 23P may be P-type silicon material. The third semiconductor pillar 23N and the first semiconductor pillar 13N may be N-type silicon material. The source line 24P may be line-shaped silicon material. The third semiconductor pillar 23N, the second semiconductor pillar 23P, and the first semiconductor pillar 13N may be pillar-shaped silicon material. In the memory cell array MCA, the second semiconductor pillar 23P may serve as a storage layer. The memory cell array MCA may further include a word line 16, and the word line 16 may be positioned on a sidewall of the second semiconductor pillar 23P. Each memory cell in the memory cell array MCA may have a 1 T (One transistor) structure. In other words, the 1 T structure may include a word line 16, a third semiconductor pillar 23N, a second semiconductor pillar 23P, and a first semiconductor pillar 13N. The third semiconductor pillar 23N and the first semiconductor pillar 13N may serve as source/drain regions. The memory cell array MCA may be a 1 T DRAM cell array without a capacitor. Since the memory cell array MCA does not have a capacitor, a refresh operation is not required.

Figure 22:
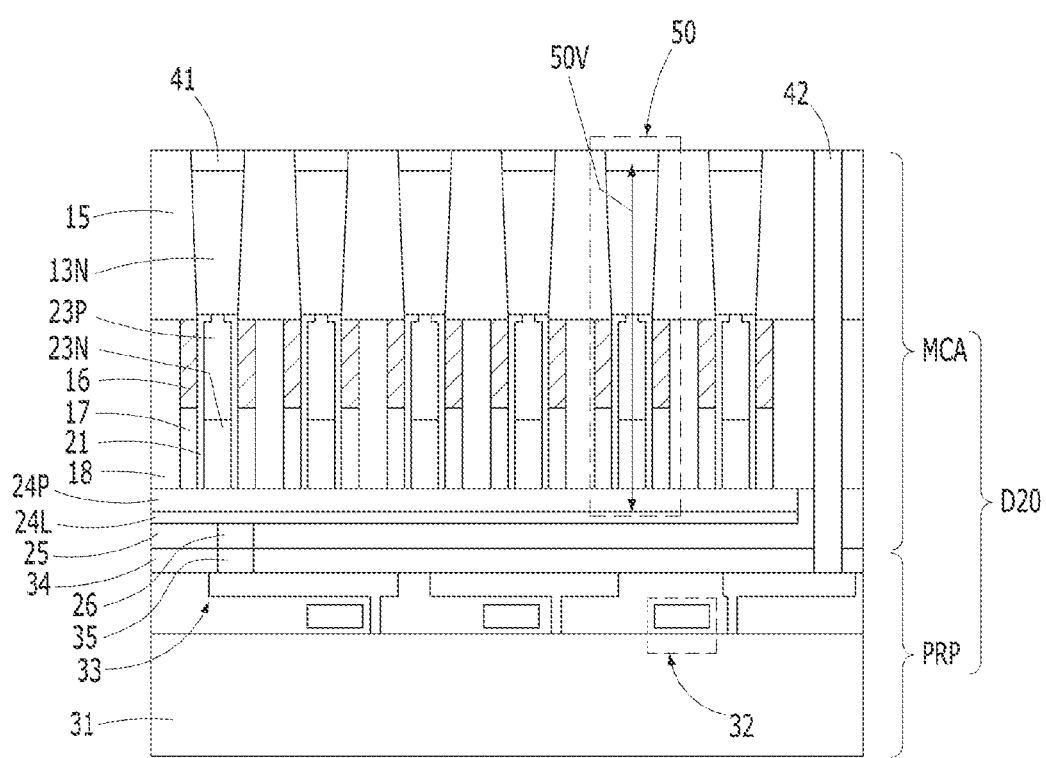

Referring to FIG. 22, a contact layer 41 may be formed. The contact layer 41 may be formed by ion implantation of a dopant. The contact layer 41 may be formed on the top surface of the first semiconductor pillar 13N.

Subsequently, a via 42 coupled to the interconnection structure 33 of the peripheral circuit unit PRP may be formed. The via 42 may be formed by forming a via hole (no reference numeral is given) to penetrate the first isolation layer 15, the second isolation layer 18, the first bonding material 25, and the second bonding material 34 and then filling the via hole with a conductive material. The via 42 may be formed of a metal-based material. The via 42 may correspond to the conductive through structure 127 of FIGS. 1 to 4.

Figure 23:
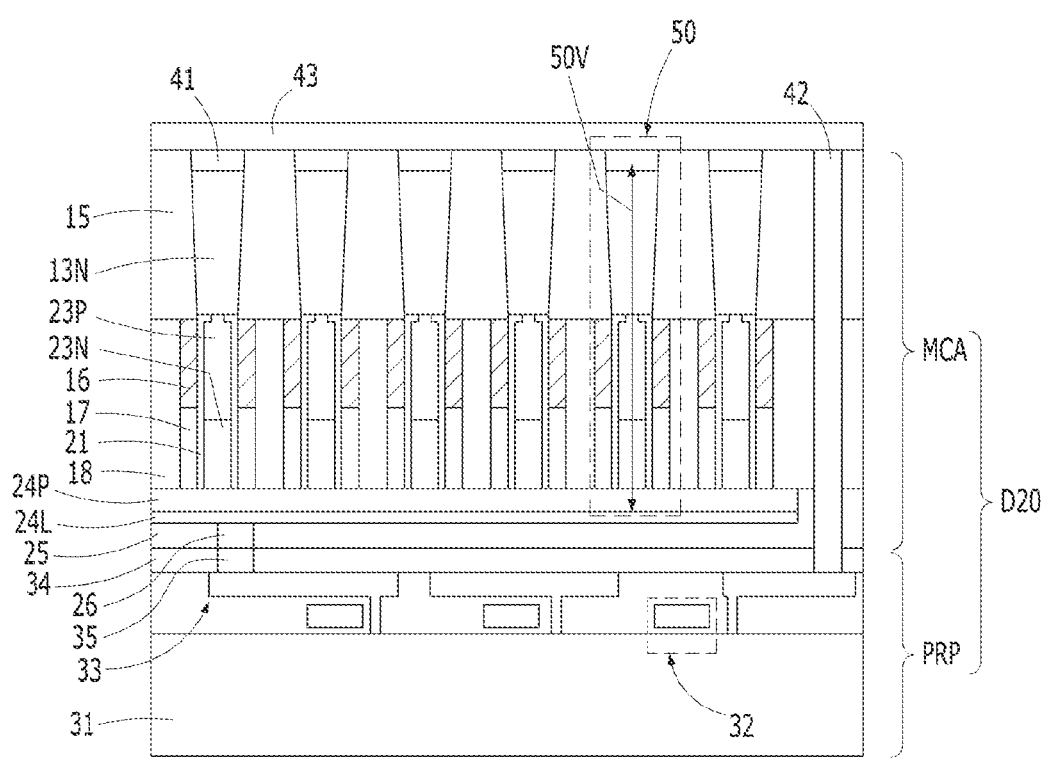

Referring to FIG. 23, an upper level conductive line coupled to the via 42 may be formed. The upper level conductive line may include a second conductive line 43. The second conductive line 43 may directly contact the contact layer 41 and the via 42. The second conductive line 43 may have a shape of a line extending in one direction. The second conductive line 43 may include a metal-based material. The second conductive line 43 may include tungsten, tungsten nitride, tungsten silicide, or a combination thereof. For example, the second conductive line 43 may be formed by depositing a tungsten silicide layer and performing an etch process. The second conductive line 43 may be a constituent element that is included in the memory cell array MCA.

The second conductive line 43 and the word line 16 may extend in directions crossing each other. During the operation of the memory cell array MCA, the second conductive line 43 may serve as a bit line.

As described above, the substrate stack D20 may include a memory cell array MCA and a peripheral circuit unit PRP, and the memory cell array MCA and the peripheral circuit unit PRP may be bonded to each other by a bonding process. By this bonding process, three-terminal wiring including the first conductive line 24L, the second conductive line 43, and the word line 16 is possible.

Referring to FIGS. 6 to 23, a method for fabricating a memory device in accordance with an embodiment may include: forming a memory cell array MCA that includes a vertical thyristor 50V and a word line 16 over a first substrate 11; forming a peripheral circuit unit PRP in a second substrate 31, bonding the memory cell array MCA and the peripheral circuit unit PRP, removing the first substrate 11 to expose one side of the vertical thyristor 50V, and forming a second conductive line 43 coupled to the one side of the vertical thyristor 50V and the peripheral circuit unit PRP. The second conductive line 43 may include a bit line.

FIGS. 24 to 33 illustrate a method of fabricating a memory device in accordance with another embodiment.

Figure 24:
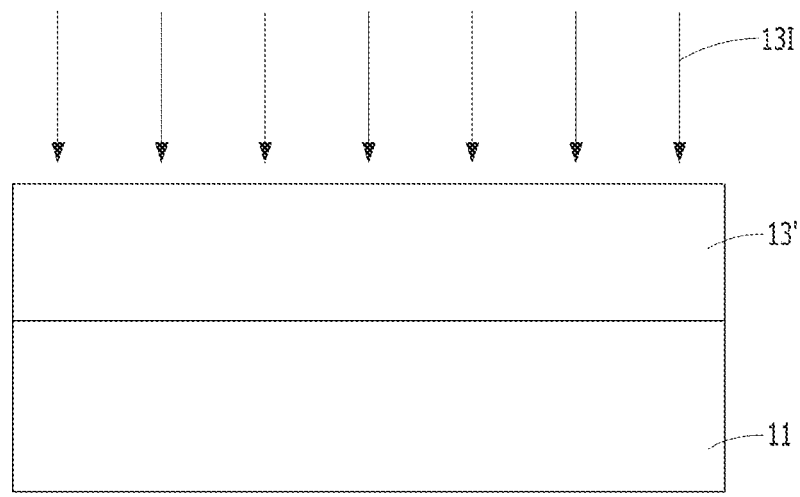
FIGS. 24 to 33 illustrate a method of fabricating a memory device in accordance with another embodiment.

Referring to FIG. 24, a first substrate 11 may be prepared. The first substrate 11 may be of a material suitable for semiconductor processing. The first substrate 11 may include a semiconductor substrate. The first substrate 11 may be formed of a silicon-containing material. The first substrate 11 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The first substrate 11 may include other semiconductor materials, such as germanium. The first substrate 11 may include a III/V-group semiconductor substrate, for example, a compound semiconductor substrate, such as GaAs. The first substrate 11 may be a sacrificial substrate which is removed by the subsequent backside grinding process. The first substrate 11 may be thicker than the first substrate 11 shown in FIG. 6.

A preliminary pillar region 13' may be formed in the first substrate 11. The preliminary pillar region 13' may be formed by a doping process 131 of the first dopant. The doping process 131 of the first dopant may include an ion implantation process. The preliminary pillar region 13' may include a first dopant, and the first dopant may include an N-type dopant, a P-type dopant, or a combination thereof. According to an embodiment, the first dopant may include an N-type dopant, such as phosphorous or arsenic. The preliminary pillar region 13' may be formed by the ion implantation process of the N-type dopant, and thus the preliminary pillar region 13' may be referred to as an 'N-type doped region'. The N-type dopant doped in the preliminary pillar region 13' may have a high concentration. For example, the N-type dopant doped in the preliminary pillar region 13' may have a high concentration of approximately $1\times10^{19}$ to $5\times10^{20}$ atoms/cm$^3$. The doped region 12' may include a highly doped N-type silicon material, that is, N$^+$ silicon. The preliminary pillar area 13' may have a depth of approximately 1000 Å to 2000 Å. For example, the depth of the preliminary pillar region 13' may be a depth that bisects the first substrate 11 in the depth direction.

Unlike the preliminary pillar region 13 of FIG. 7 being formed by an epitaxial growth process, the preliminary pillar region 13' may be formed by the doping process 131 of an N-type impurity.

Figure 25:
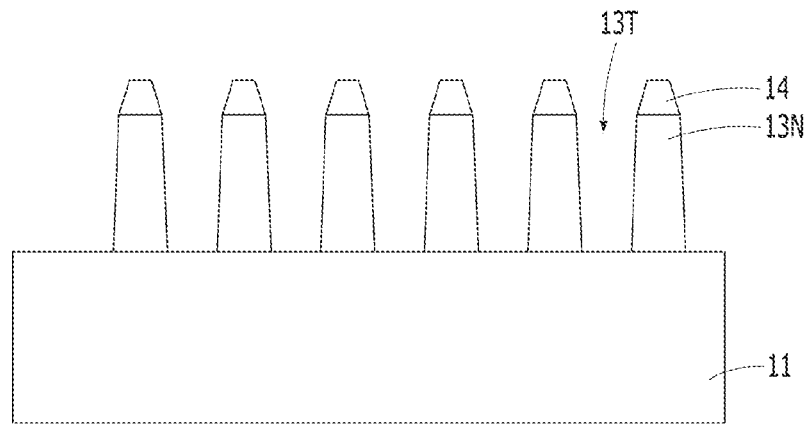

Referring to FIG. 25, a hard mask layer 14 may be formed over the preliminary pillar region 13'. The hard mask layer 14 may include a material having an etch selectivity with respect to the preliminary pillar region 13'. The hard mask layer 14 may include silicon oxide, silicon nitride, amorphous carbon, or a combination thereof. According to an embodiment, the hard mask layer 14 may include silicon oxide.

The hard mask layer 14 may be etched by using a mask (not shown) to expose the top surface of the preliminary pillar region 13'. The mask may include a photoresist pattern. From the perspective of a top view, the hard mask layer 14 may have a plurality of pillar shapes. In other words, the hard mask layer 14 may be formed of a regular array of pillar shapes.

Subsequently, first semiconductor pillars 13N may be formed. In order to form the first semiconductor pillars 13N, the preliminary pillar region 13' may be etched by using the hard mask layer 14. Since the hard mask layer 14 has a plurality of pillar arrays, the preliminary pillar region 13' may be etched into the first semiconductor pillars 13N. The first semiconductor pillars 13N may be formed as a regular array of pillar shapes.

An isolation trench 13T may be defined between the neighboring first semiconductor pillars 13N. The isolation trench 13T may space the neighboring first semiconductor pillars 13N apart from each other. The depth of the isolation trench 13T may be the same as the height of the first semiconductor pillars 13N. The height of the first semiconductor pillar 13N may be approximately 2000 Å. The depth of the isolation trench 13T may be the same as the height of the first semiconductor pillars 13N. The depth of the isolation trench 13T may be approximately 2000 Å. According to another embodiment, the depth of the isolation trench 13T may be greater than the height of the first semiconductor pillars 13N.

From the perspective of a top view, a cross-section of the first semiconductor pillars 13N may have a rectangular shape or a circular shape. According to an embodiment, the cross-section of the first semiconductor pillars 13N may have a rectangular shape.

The first semiconductor pillars 13N may be N-type silicon pillars.

Figure 26:
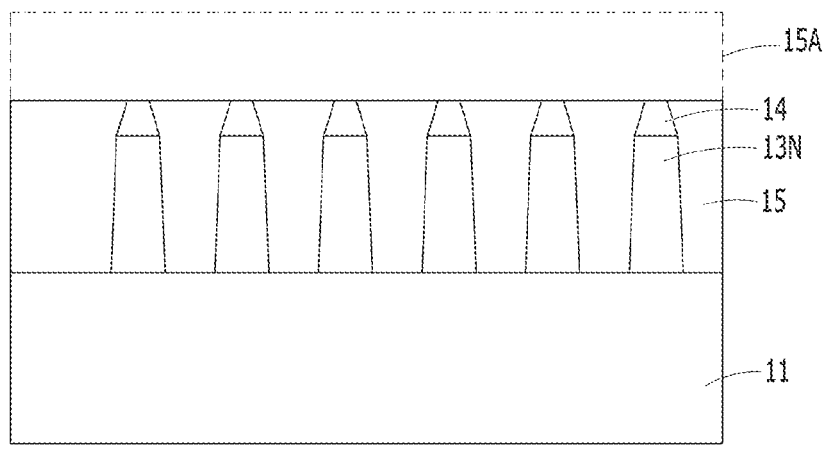

Referring to FIG. 26, the isolation trench 13T may be filled with a dielectric material 15A. The dielectric material 15A may fill the isolation trench 13T without voids. The dielectric material 15A may include a material having excellent gap-fill characteristics. The dielectric material 15A may include oxides, nitrides or combinations thereof. According to an embodiment, the dielectric material 15A may include silicon oxide.

The dielectric material 15A may be formed to cover the hard mask layer 14 while filling the isolation trench 13T. Subsequently, the dielectric material 15A may be planarized to expose the top surface of hard mask layer 14. The planarization of the dielectric material 15A may be performed by a Chemical Mechanical Polishing (CMP) process. A first isolation layer 15 may be formed by the planarization of the dielectric material 15A.

The hard mask layer 14 may remain in the planarization process of the dielectric material 15A. Therefore, the top surface of the first separation layer 15 and the top surface of the hard mask layer 14 may be positioned at the same level. In other words, a step may not be formed between the top surface of the first isolation layer and the top surface of the hard mask layer 14. The first isolation layer 15 may isolate the neighboring first semiconductor pillars 13N from each other.

Figure 27:
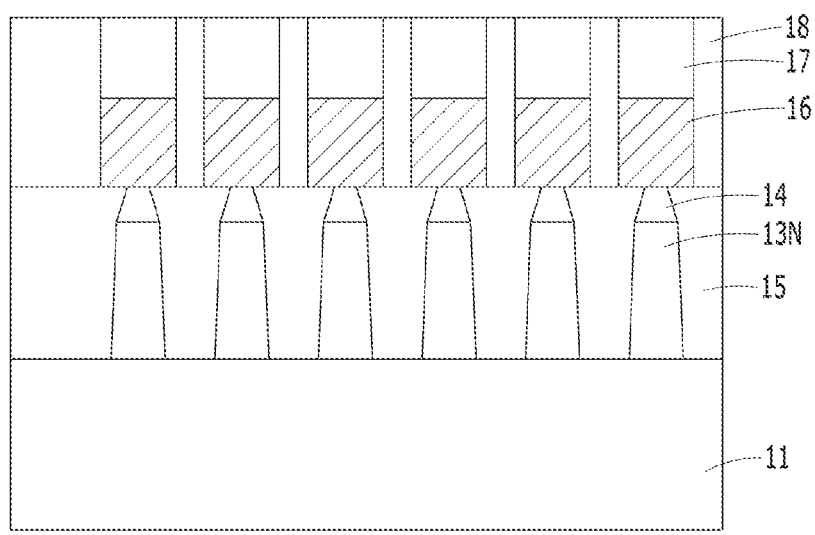

Referring to FIG. 27, a plurality of word lines 16 may be formed over the first isolation layer 15 and the hard mask layer 14. A method for forming the word lines 16 will be described with reference to FIGS. 10 and 11. The word lines 16 may be formed to correspond to the first semiconductor pillars 13N, respectively.

Subsequently, a second isolation layer 18 may be formed between the word lines 16. The second isolation layer 18 may include silicon oxide. The second isolation layer 18 may fill the space between the neighboring word lines 16 and may be planarized to expose the top surface of the word lines 16.

Figure 28:
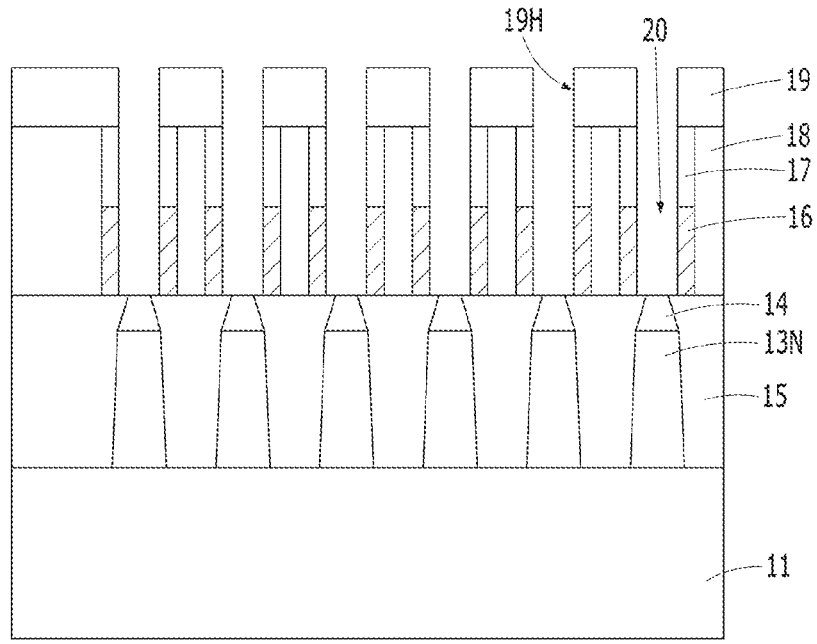

Referring to FIG. 28, a mask layer 19 may be formed. The mask layer 19 may include a photoresist pattern. The mask layer 19 may include a plurality of openings 19H. From the perspective of a top view, a cross-section of the openings 19H may be rectangular or circular in shape, and the openings 19H may be formed as a regular array.

Subsequently, a capping layer 17 and the word lines 16 may be sequentially etched by using a mask layer 19. As a result, a plurality of vertical openings 20 may be formed. The vertical openings 20 may have a depth penetrating the capping layer 17 and the word lines 16. From the perspective of a top view, a cross-section of the vertical opening 20 may be the same shape as the openings 19H of the mask layer 19. The bottom surface of the vertical openings 20 may expose the top surface of the hard mask layer 14. The vertical openings 20 may have a vertical sidewall. The vertical openings 20 may have a size that does not expose both sidewalls of each word line 16. Thus, the vertical openings 20 may be shaped to be surrounded by the word lines 16.

Figure 29:
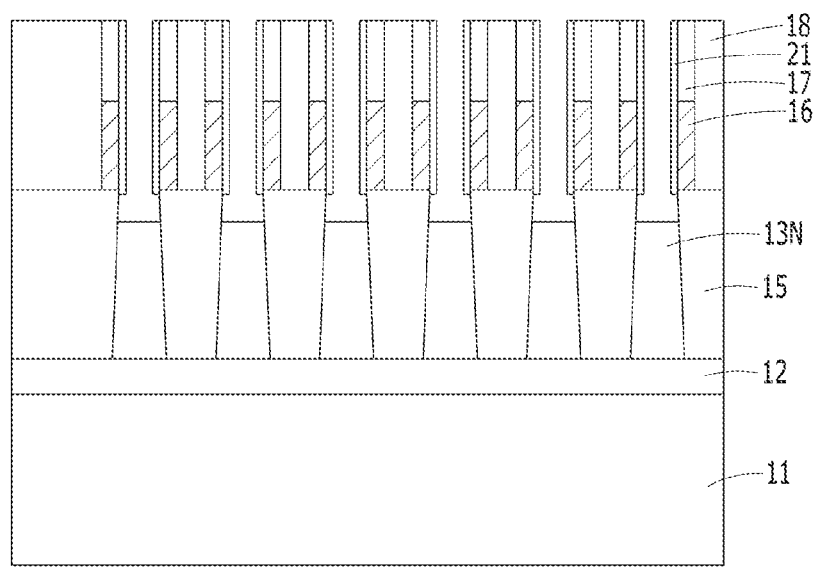

Referring to FIG. 29, after the mask layer 19 is removed, a gate dielectric layer 21 may be formed in the vertical openings 20. A method for forming the gate dielectric layer 21 will be described with reference to FIGS. 14 and 15.

Subsequently, the hard mask layer 14 may be removed. When the hard mask layer 14 includes silicon nitride, it may be removed by a wet etch process using phosphoric acid. While the hard mask layer 14 is removed, the lower end portion of the gate dielectric layer 21 may be partially removed.

After the hard mask layer 14 is removed, the top surface of the first semiconductor pillars 13N may be exposed by the downward expansion of the vertical openings 20. The lower end of the gate dielectric layer 21 may be spaced apart from the top surface of the first semiconductor pillars 13N. A space from which the hard mask layer 14 is removed, that is, a recess, may be formed below the gate dielectric layer 21.

Figure 30:
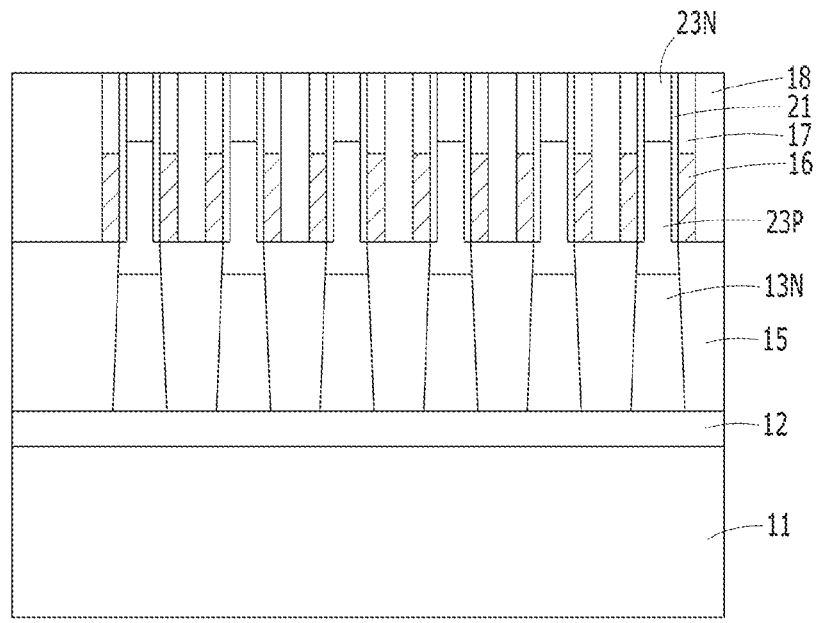

Referring to FIG. 30, a stack of a second semiconductor pillar 23P and a third semiconductor pillar 23N may be formed in a vertical opening 20. A method for forming the stack of the second semiconductor pillar 23P and the third semiconductor pillar 23N will be described with reference to FIGS. 16 and 17.

The second semiconductor pillar 23P may be formed over the first semiconductor pillar 13N, and the third semiconductor pillar 23N may be formed over the second semiconductor pillar 23P. The top surface of the third semiconductor pillar 23N and the top surface of the capping layer 17 may be positioned at the same level.

The top surface of the second semiconductor pillar 23P may be positioned at the same level as the top surface of the word line 16 or higher than the top surface of the word line 16. The third semiconductor pillar 23N may have a height lower than that of the second semiconductor pillar 22P. The lower end of the second semiconductor pillar 23P may directly contact the first semiconductor pillar 13N.

The third semiconductor pillar 23N may include an N-type dopant having a higher concentration than that of the first semiconductor pillar 13N. The second semiconductor pillar 23P may include a P-type dopant having a lower concentration than that of the third semiconductor pillar 23N. In other words, the third semiconductor pillar 23N may include a high-concentration N-type dopant, and the second semiconductor pillar 23P may include a P-type dopant having a lower concentration than that of the high-concentration N-type dopant.

The second semiconductor pillar 23P may be P-type epitaxial silicon, and the third semiconductor pillar 23N may be highly doped N-type epitaxial silicon.

Since the second semiconductor pillar 23P and the third semiconductor pillar 23N fill the vertical opening 20, the vertical opening 20 may be filled with a pillar structure. The stack of the first semiconductor pillar 13N, the second semiconductor pillar 23P, and the third semiconductor pillar 23N may form a vertical pillar structure. The stack of the first semiconductor pillar 13N, the second semiconductor pillar 23P, and the third semiconductor pillar 23N may be a stack of silicon materials. The stack of the first semiconductor pillar 13N, the second semiconductor pillar 23P, and the third semiconductor pillar 23N may be a stack of epitaxial silicons.

Figure 31:
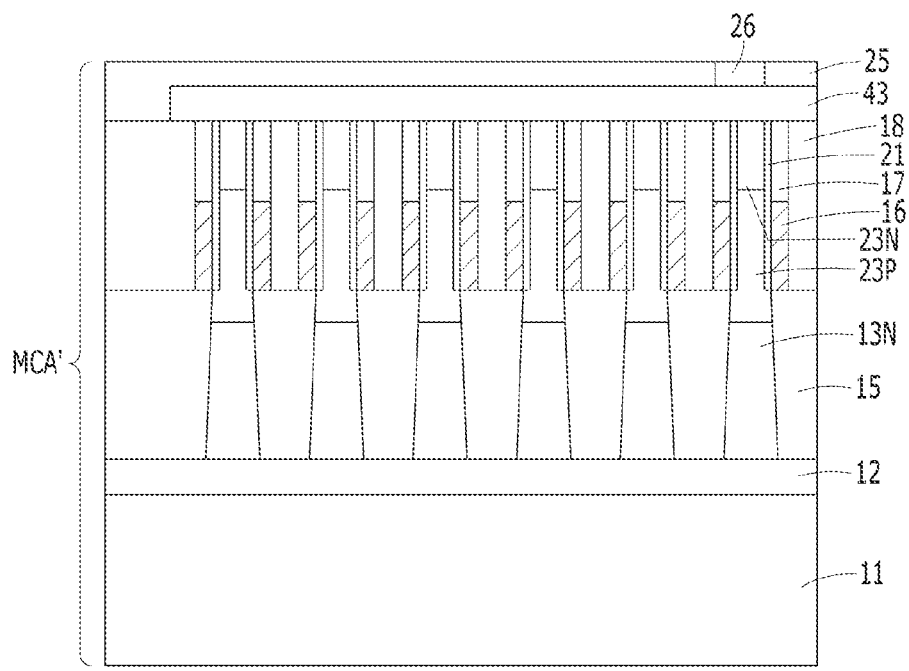

Referring to FIG. 31, a lower level conductive line may be formed. The lower level conductive line may include a second conductive line 43. The second conductive line 43 may have a shape of a line extending in one direction. The second conductive line 43 may include a metal-based material. The second conductive line 43 may include tungsten, tungsten nitride, tungsten silicide, or a combination thereof. For example, the second conductive line 43 may be formed by depositing a tungsten silicide layer and performing an etch process. The second conductive line 43 may couple the neighboring third semiconductor pillars 23N to each other.

The second conductive line 43 may be a constituent element included in the memory cell array MCA'. The second conductive line 43 and the word line 16 may extend in directions crossing each other. During the operation of the memory cell array MCA', the second conductive line 43 may serve as a bit line.

As described above, according to an embodiment, the second conductive line 43 may be formed prior to the formation of the source line. FIGS. 18 to 24 show the formation of the second conductive line after the source line is formed first.

A first bonding material 25 may be formed over the second conductive line 43. The first bonding material 25 may include silicon oxide. A portion of the first bonding material 25 may cover the second isolation layer 18.

A first bonding pad 26 coupled to the second conductive line 43 may be formed by penetrating the first bonding material 25. The first bonding pad 26 may include a metal-based material.

The memory cell array MCA' may be formed through a series of the processes described above.

Figure 32:
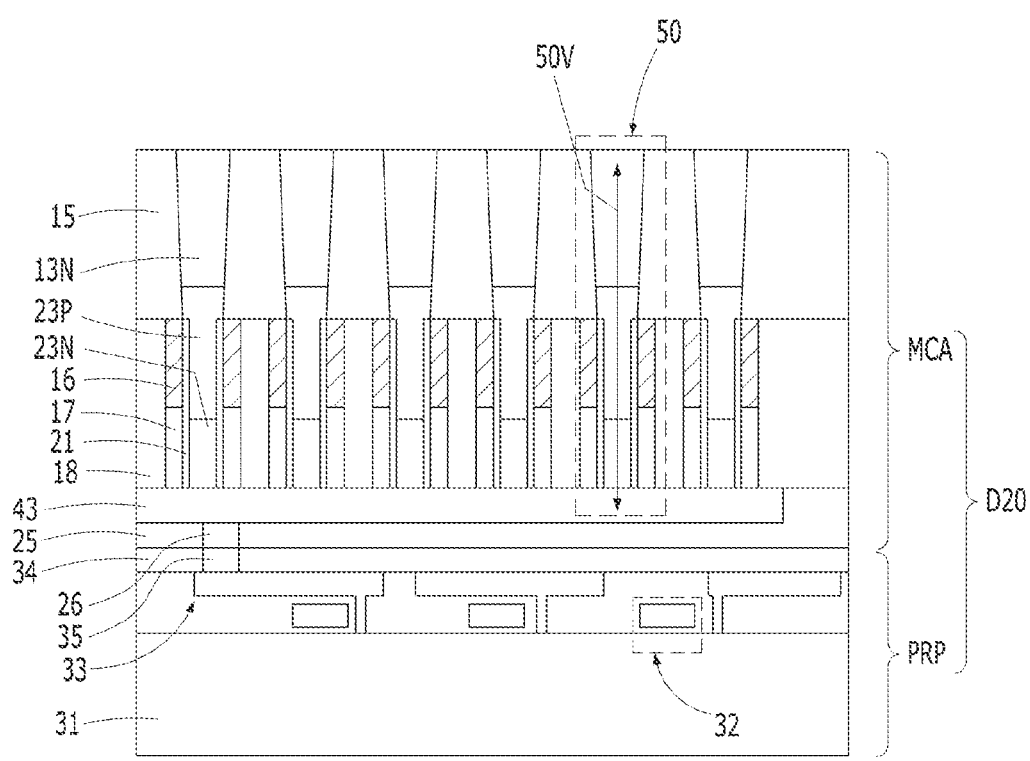

Subsequently, a series of processes illustrated in FIGS. 19 to 21 may be performed. As a result, a substrate stack D20 for a memory device may be formed, as shown in FIG. 32. The substrate stack D20 may be a stack of a peripheral circuit unit PRP and a memory cell array MCA. The memory cell array MCA may be positioned at a higher level than the peripheral circuit unit PRP. The memory cell array MCA may include a plurality of memory cells 50, and each of the memory cells 50 may include a stack of a third semiconductor pillar 23N, a second semiconductor pillar 23P, and a first semiconductor pillar 13N. The third semiconductor pillar 23N may be referred to as a lower semiconductor pillar, and the first semiconductor pillar 13N may be referred to as an upper semiconductor pillar, while the second semiconductor pillar 23P may be referred to as a storage pillar. The stack of the third semiconductor pillar 23N, the second semiconductor pillar 23P, and the first semiconductor pillar 13N may be a stack of silicon materials having an NPN structure. The memory cell array MCA may further include a word line 16, and the word line 16 may be positioned on a sidewall of the second semiconductor pillar 23P. Each memory cell in the memory cell array MCA may have a 1 T (One transistor) structure. In other words, the 1 T structure may include the word line 16, the third semiconductor pillar 23N, the second semiconductor pillar 23P, and the first semiconductor pillar 13N. The third semiconductor pillar 23N and the first semiconductor pillar 13N may serve as source/drain regions. The memory cell array MCA may be a 1 T DRAM cell array without a capacitor. Since the memory cell array MCA does not have a capacitor, a refresh operation is not required.

In the substrate stack D20, the memory cell array MCA may be bonded to the peripheral circuit unit PRP. The peripheral circuit unit PRP may include a second substrate 31, at least one control circuit 32 that is formed over the second substrate 31, an interconnection structure 33, and a second bonding material 34. The at least one control circuit 32 may include a transistor. The interconnection structure 33 may include at least one metal line. The interconnection structure 33 may include a multi-level metal line (MLM). The interconnection structure 33 may be coupled to a portion of the control circuit 32. A second bonding material 34 may be formed over the interconnection structure 33. The second bonding material 34 may include silicon oxide. The first bonding material 25 and the second bonding material 34 may be of the same material. A second bonding pad 35 coupled to the interconnection structure 33 may be formed by penetrating the second bonding material 34. The second bonding pad 35 may include a metal-based material. The first bonding pad 26 and the second bonding pad 35 may be formed of the same material. The first bonding material 25 and the second bonding material 34 may be bonded to each other. Likewise, the first bonding pad 26 and the second bonding pad 35 may be bonded to each other.

Figure 33:
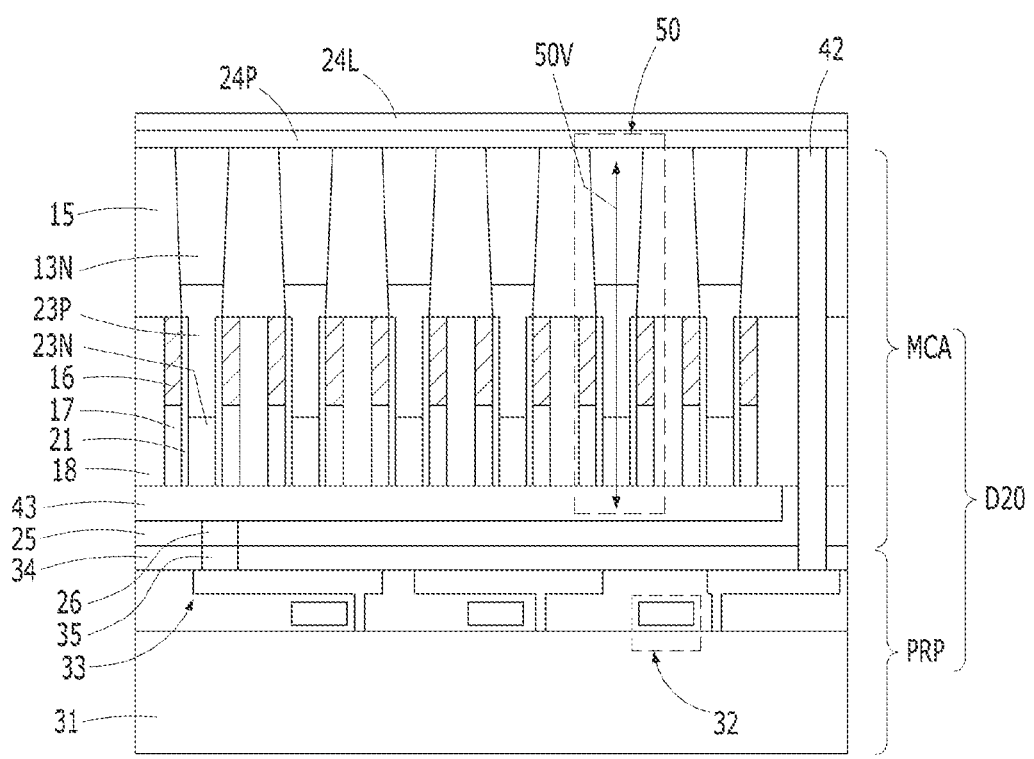

Referring to FIG. 33, a via 42 coupled to the interconnection structure 33 of the peripheral circuit unit PRP may be formed. The via 42 may be formed by forming a via hole (no reference numeral is given) to penetrate the first isolation layer 15, the second isolation layer 18, the first bonding material 25, and the second bonding material 34 and then filling the via hole with a conductive material. The via 42 may be formed of a metal-based material.

Subsequently, an upper level conductive line coupled to the via 42 may be formed. The upper level conductive line may include a stack of a source line 24P and a first conductive line 24L. The source line 24P may include a high-concentration P-type dopant. The source line 24P may include high-concentration P-type polysilicon. The source line 24P may couple the neighboring third semiconductor pillars 23N to each other. The source line 24P and the first conductive line 24L may be formed by depositing a source line material and a conductive material and then etching the conductive material and the source line material. The source line 24P and the first conductive line 24L may extend in a direction crossing the word line 16. The first conductive line 24L may include tungsten silicide.

Referring to FIGS. 24 to 33, a method for fabricating a memory device in accordance with another example of an embodiment may include: forming a memory cell array MCA including a vertical thyristor 50V, a word line 16, and a bit line over a first substrate 11, forming a peripheral circuit unit PRP in the second substrate 31, bonding the memory cell array MCA and the peripheral circuit unit PRP, removing the first substrate 11 to expose one side of the vertical thyristor 50V, and forming a source line 24P coupled to one side of the vertical thyristor 50V and the peripheral circuit unit PRP. The bit line may correspond to the second conductive line 43.

The memory device fabrication method of FIGS. 24 to 33 may be mostly the same as the memory device fabrication method of FIGS. 6 to 23. However, the order of forming the stack of the source line 24P/the first conductive line 24L and forming the second conductive line 43 may be different from each other.

According to the embodiments, it may be possible to realize a system-friendly memory device capable of performing a memory operation without performing a refresh operation by eliminating capacitors.

According to the embodiments, it may be possible to realize a high-integration memory device by using a vertical thyristor and realizing 4 $F^2$.

According to the embodiments, it may be possible to simplify a process by fabricating a capacitor-less memory device.

While the present embodiments have been described with respect to the specific embodiments, it will be apparent to those skilled in the art that various changes and modifications may be made without departing from the spirit and scope of the disclosure as defined in the following claims.

What is claimed is:
1. A vertical memory device, comprising:
a peripheral circuit unit that comprises at least one control circuit;

a memory cell array that comprises a vertical thyristor, a word line, and a bit line that are formed above the peripheral circuit unit;

a lower level conductive line electrically connected to a lower portion of the vertical thyristor;

a first bonding pad electrically connected to the lower level conductive line and disposed between the memory cell array and the peripheral circuit unit;

a second bonding pad electrically connected to the peripheral circuit unit and bonded to the first bonding pad; and a conductive through structure suitable for electrically connecting the peripheral circuit unit and the memory cell array to each other.

2. The vertical memory device of claim 1, wherein the vertical thyristor comprises:

a line-type source line;

a first semiconductor pillar over the line-type source line;

a second semiconductor pillar over the first semiconductor pillar; and a third semiconductor pillar over the second semiconductor pillar.

3. The vertical memory device of claim 2, wherein the line-type source line and the second semiconductor pillar are doped with a P-type impurity, the first semiconductor pillar and the third semiconductor pillar are doped with an N-type impurity, and wherein the line-type source line, the first semiconductor pillar, the second semiconductor pillar, and the third semiconductor pillar are stacked vertically to form a PNPN thyristor.

4. The vertical memory device of claim 1, wherein the vertical thyristor comprises:

a P-type polysilicon having a line shape;

a first N-type epitaxial silicon pillar over the P-type polysilicon;

a P-type epitaxial silicon pillar over the first N-type epitaxial silicon pillar; and a second N-type epitaxial silicon pillar over the P-type epitaxial silicon pillar.

5. The vertical memory device of claim 1, wherein the vertical thyristor has a shape penetrating the word line.

6. The vertical memory device of claim 1, wherein the bit line is coupled to a top portion of the vertical thyristor.

7. The vertical memory device of claim 1, wherein the conductive through structure comprises a via that couples the at least one control circuit to the bit line.

8. The vertical memory device of claim 1, wherein the at least one control circuit comprises a sense amplifier, a word line driver or both the sense amplifier and the word line driver.

9. The vertical memory device of claim 1, further comprising:

a first bonding material comprising an oxide and positioned below the vertical thyristor of the memory cell array; and a second bonding material comprising an oxide and positioned over the peripheral circuit unit, and wherein the memory cell array and the peripheral circuit unit comprise oxide-to-oxide bonding of the first bonding material and the second bonding material.

10. The vertical memory device of claim 9, wherein the first bonding pad comprises a metal-based material suitable for penetrating the first bonding oxide, wherein the second bonding pad comprises a metal-based material suitable for penetrating the second bonding oxide, and wherein the memory cell array and the peripheral circuit unit comprise metal-to-metal bonding of the first bonding pad and the second bonding pad.

11. The vertical memory device of claim 1, further comprising:

an isolation layer between vertical thyristors.

12. The vertical memory device of claim 1, wherein the bit line is at higher level than the vertical thyristor and is not coupled to the first and second bonding pads.

* * * * *